US012715977B2

(12) United States Patent
Silvi

(10) Patent No.: US 12,715,977 B2
(45) Date of Patent: Aug. 25, 2026

(54) POLYCARBONATE COMPOSITIONS INCLUDING CARBON NANOTUBES (CNTS) AS MICROWAVE ABSORBERS IN AUTOMOTIVE RADAR SENSOR APPLICATIONS

(71) Applicant: SHPP GLOBAL TECHNOLOGIES B.V., Bergen op Zoom (NL)

(72) Inventor: Norberto Silvi, Selkirk, NY (US)

(73) Assignee: SHPP Global Technologies B.V., Bergen op Zoom (NL)

( * ) Notice: Subject to any disclaimer, the term of this patent is extended or adjusted under 35 U.S.C. 154(b) by 215 days.

(21) Appl. No.: 18/705,105

(22) PCT Filed: Oct. 26, 2022

(86) PCT No.: PCT/IB2022/060297
§ 371 (c)(1),
(2) Date: Apr. 26, 2024

(87) PCT Pub. No.: WO2023/073582
PCT Pub. Date: May 4, 2023

(65) Prior Publication Data

US 2024/0417530 A1 Dec. 19, 2024

(30) Foreign Application Priority Data

Oct. 29, 2021 (EP) .................................... 21205707

(51) Int. Cl.
*C08K 3/04* (2006.01)
*C08J 3/22* (2006.01)
*C08L 83/10* (2006.01)
*H05K 9/00* (2006.01)

(52) U.S. Cl.
CPC ............... *C08K 3/041* (2017.05); *C08J 3/226* (2013.01); *C08L 83/10* (2013.01); *H05K 9/009* (2013.01);
(Continued)

(58) Field of Classification Search
CPC .............. C08K 3/041; C08K 2201/003; C08K 2201/004; C08K 2201/006;
(Continued)

(56) References Cited

U.S. PATENT DOCUMENTS

2016/0355670 A1 12/2016 Lee et al.
2018/0177081 A1 6/2018 Ghosh
2018/0370197 A1 12/2018 Nagamune et al.

FOREIGN PATENT DOCUMENTS

CN 107674385 A * 2/2018 ............. B29C 70/48
CN 213862058 U * 8/2021 .............. C08L 83/04
(Continued)

OTHER PUBLICATIONS

Nanocyl, NC7000 Technical Data Sheet, V08, Jul. 12, 2016 (4 pgs.).
(Continued)

*Primary Examiner* — Resha Desai
*Assistant Examiner* — Peter Davon Doze
(74) *Attorney, Agent, or Firm* — Quicker Law, LLC

(57) ABSTRACT

Thermoplastic compositions include: (a) a polycarbonate resin: (b) a poly (carbonate-siloxane) copolymer having a siloxane content of at least about 5 wt %; and (c) from about 0.15 wt % to about 4.5 wt % of a carbon nanotube filler. The carbon nanotubes have an average diameter of from about 8-12 nanometers (nm), a length of about 5 micron (μm) or less, a surface area of about 220 square meters per gram ($m^2$/gr) or higher, and a volume resistivity lower than about $10^{-2}$ Ohm·centimeters (Ohm·cm). The composition has a volume electrical resistivity of at least about 1.0E+06 Ohm·cm as determined in accordance with ASTM D257. A molded sample of the composition has a percent absorbed power measured in Transmission mode of at least about 60% when observed according to a Free Space method at frequencies from about 75 GHz to 110 GHZ.

15 Claims, 23 Drawing Sheets

(52) U.S. Cl.
CPC .. *C08K 2201/001* (2013.01); *C08K 2201/003* (2013.01); *C08K 2201/004* (2013.01); *C08K 2201/006* (2013.01); *C08K 2201/011* (2013.01); *C08L 2205/025* (2013.01)

(58) Field of Classification Search
CPC .... C08K 2201/011; C08L 69/00; C08L 83/10; C08L 2205/025; C08L 2205/035; C08G 77/448; C08J 2369/00; H01Q 17/00; H05K 9/009
See application file for complete search history.

(56) References Cited

FOREIGN PATENT DOCUMENTS

| | | | | | |
|---|---|---|---|---|---|
| EP | 1471114 | A1 | | 10/2004 | |
| EP | 3239225 | B1 | | 5/2021 | |
| EP | 3845587 | A1 | | 7/2021 | |
| JP | S55-160052 | A | | 12/1980 | |
| JP | 2003-221508 | A | | 8/2003 | |
| JP | 2005-036200 | A | | 2/2005 | |
| JP | 2006-227177 | A | | 8/2006 | |
| JP | 2014-045802 | A | | 3/2014 | |
| JP | 6927448 | B1 | * | 9/2021 | ............. H05K 9/009 |
| KR | 10-2012-0078417 | A | | 7/2012 | |
| RU | 2668037 | C2 | * | 9/2018 | ........... B29C 48/385 |
| WO | 2012/153063 | A1 | | 11/2012 | |
| WO | 2021/137192 | A1 | | 7/2021 | |

OTHER PUBLICATIONS

Burger et al. "Beyond the Headlights: ADAs and Autonomous Sensing", Market Report, Woodside Capital Partners, 2016, 77 pgs.
International Search Report and Written Opinion mailed Jan. 30, 2023 in PCT/IB2022/060297 (10 pgs.).
LAIRD Performance Materials, "Cavity Resonance", 2019 (6 pgs.).

* cited by examiner

Percent Absorbed Power in Transmission Mode

Absorbed Power%

100
90
80
70
60
50
40
30
20
10
0

7.5
8
8.5
9
9.5
10
10.5
11
x10^10

Frequency (Hz)

E1.4
C2
C1
E2.4
E1.2
E2.2
E2.1
E1.1
E2.3
E1.3

POLYCARBONATE COMPOSITIONS INCLUDING CARBON NANOTUBES (CNTS) AS MICROWAVE ABSORBERS IN AUTOMOTIVE RADAR SENSOR APPLICATIONS

CROSS-REFERENCE TO RELATED APPLICATION

This application is the National Stage of International Application No. PCT/IB2022/060297 filed Oct. 26, 2022, which claims priority to and the benefit of European Application No. 21205707.9 filed Oct. 29, 2021, the disclosures of which are incorporated herein by this reference in their entireties.

FIELD OF THE DISCLOSURE

The present disclosure relates to carbon-filled polycarbonate compositions, and in particular to polycarbonate compositions including carbon nanotube filler that have improved dielectric properties.

BACKGROUND OF THE DISCLOSURE

The automotive industry is increasingly making use of electronic radar sensors to provide assistance to drivers with features such as adaptive cruise control, parking/lane change assist, back-up warning, blind spot detection, collision avoidance, and many others. For these sensors to operate effectively, they must be protected from spurious sources of electromagnetic radiation. Radar sensors for automotive applications include Radome-type plastic components, which are mostly transparent to microwave radiation, and Absorber-type plastic components, which trap microwave energy in a certain frequency range to protect the sensor from outside radiation interference. These plastic components are usually injection molded into the final part using relatively high injection pressures and melt temperatures. Microwave absorbing materials made from carbon black powder, graphite or carbon fibers usually require relatively large quantities of the carbon filler to provide enough shielding interference in the K-band and W-band of the electromagnetic spectrum.

According to the Association For Safe International Road Travel (ASIRT), nearly 1.3 million people (400,000 of them under the age of 25) die in road crashes each year, with an additional of at least 20 million people being injured or disabled. Road traffic crashes rank as the 9th leading cause of death, accounting for 2.2% of all deaths globally, and costing USD $518 billion globally, or about 1-2% of individual countries' annual GDP. Unless action is taken, road traffic injuries are predicted to become the fifth leading cause of death by 2030 (Association For Safe International Road Travel—ASIRT, 2016). For these reasons, the automotive industry is increasingly making use of Advanced Driver Assistance Systems (ADAS) to provide drivers assistance with features such as adaptive cruise control, self-parking, back-up warning, blind spot detection, lane departure warning, collision avoidance, pedestrian detection, and many others.

Due to the fact that their cost has come down substantially, and the supply chain is now much more established, radar sensors are common in automotive safety today as they are used in most advanced ADAS systems. These automotive radar systems can be divided into three sub-categories depending on the range or distance over which they operate:

short-range, mid-range and long-range automotive radars. Each of these sensors has different applications, with long-range radars (range over 100 meters or so) being usually used for forward collision avoidance and adaptive cruise control, operating mainly in the W-band of the electromagnetic spectrum at frequencies between about 75 and 110 gigahertz (GHz). Short- and mid-range radars (range in the 10s of meters), on the other hand, are used for blind-spot detection, parking assist systems, pre-crash alerts, or lane departure warnings, and operate mainly in the K-band at frequencies between about 18 and 26.5 GHZ. The K-band frequency range has strict regulations regarding power output at lower frequencies and is expected to become less prevalent. (Source: Burger, R., Salinero, T., Sumida, S., "Beyond The Headlights: ADAS and Autonomous Sensing": Market Report, Woodside Capital Partners: September 2016).

Microwave radiation (~1-300 GHz frequency, ~300-1 millimeter (mm) wavelength) is the most common source of electromagnetic energy used in the operation of radar sensors for automotive applications. Materials used in ADAS applications to shield automotive safety sensors from damaging microwave electromagnetic radiation include: metals (e.g., aluminum and stainless steel): polymer compositions including metallic fillers such as aluminum flakes, stainless steel fibers or silver-coated polyamide fibers: metalized coatings: inherently conductive polymers such as polyacetylene, polypyrrole, polythiophene, polyaniline: silicon carbide: ferrites ($Fe_2O_3$+Ni/Zn/Cd/Co secondary oxide); iron silicide; and iron pentacarbonyl. Metals are the most common materials for microwave (MW) interference shielding, but they are heavy, expensive, and require complex processing to be shaped into a final part. Polymer/carbon composites, on the other hand, are desirable due to their low density, low cost, easy shaping, and manufacturability into high volume molded parts.

Carbon (powder, platelets, fibers, etc.) is emerging as a desirable filler to impart electromagnetic interference properties to thermoplastic polymers, which when unfilled are mostly transparent (non-absorbing, non-reflecting) to microwave radiation. When used in under-the-hood automotive enclosures, for example, polymer-carbon thermoplastic compositions can protect the sensors located inside the enclosure thus preventing the electromagnetic radiation from an outside source to deteriorate the sensor's electronic performance. Also, carbon-containing elastomers such as silicone, polyurethane and nitrile rubber, among several others, can be used as high-loss, protective, and deformable sheets or blankets to attenuate the resonant frequencies generated by the normal operation of the sensors inside a cavity. Besides thermoplastics and elastomers, these radar shielding materials are also sold commercially in the form of liquid paints, powder coatings and closed-cell polymer foams. Electrical conductivity, dielectric and magnetic losses, frequency of the incoming radiation, and thickness of the enclosure wall are some of the features that are expected to affect the microwave interference performance of these materials.

The choice of microwave shielding material to be used in a given situation depends to some extent on the environment surrounding the electronic component (antenna, printed circuit board, imaging equipment for medical applications, etc.) to be protected. When the incoming radiation to be suppressed or minimized originates outside of the component to be protected, a material with reflecting microwave properties, such as a metallic plate (aluminum, stainless steel, etc.), or a polymer composition including metallic fillers may be all that is required. In such a case, the enclosure protects the electronic components by reflecting the incoming radiation away from the cavity. If the incoming radiation originates inside the cavity to be protected, on the other hand, a material that absorbs microwave energy may need to be selected to isolate the sensor components from standing electromagnetic waves (oscillations) caused by cavity resonance. Microwave absorbers can also be used to cover the inside walls of testing anechoic chambers, thus eliminating unwanted reflections that would otherwise negatively affect the dielectric response of the material being tested inside the chamber.

There are several dielectric properties that radar designers consider when selecting materials for microwave radar interference. Complex permittivity (real and imaginary parts), amount of radiation Absorbed, Reflected or Transmitted by the material, Shielding Effectiveness, Reflection Loss and Attenuation are only some of the material properties of interest for the manufacture of plastic components for radar sensor applications. As noted herein, the frequency of the incoming radiation and material thickness are also important when trapping microwave energy that if not eliminated or minimized could interfere with the normal operation of the automotive electronic sensors.

Accordingly, improved materials for microwave radar interference are desirable. These and other shortcomings are addressed by aspects of the present disclosure.

SUMMARY

Aspects of the disclosure relate to thermoplastic compositions including: (a) a polycarbonate resin: (b) a poly (carbonate-siloxane) copolymer having a siloxane content of at least about 5 wt %; and (c) from about 0.15 wt % to about 4.5 wt % of a carbon nanotube filler. The composition has a volume electrical resistivity of at least about 1.0E+06 Ohm·cm as determined in accordance with ASTM D257. A molded sample of the composition has a percent absorbed power measured in Transmission mode of at least about 60% when observed according to a Free Space method at frequencies from about 75 GHz to 110 GHz.

BRIEF DESCRIPTION OF THE FIGURES

In the drawings, which are not necessarily drawn to scale, like numerals may describe similar components in different views. Like numerals having different letter suffixes may represent different instances of similar components. The drawings illustrate generally, by way of example, but not by way of limitation, various aspects discussed in the present document.

DETAILED DESCRIPTION

Figure 1A:
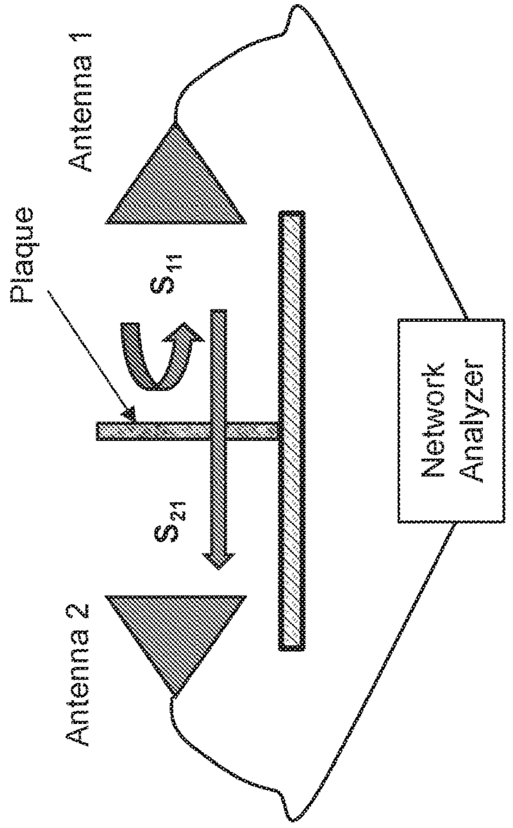
FIGS. 1A and 1B are schematic depictions of the apparatus used to determine the dielectric properties of the materials of this disclosure using the Free Space Method for un-backed and metal-backed samples, respectively.

The present disclosure relates to thermoplastic compositions including relatively low levels of multi-wall carbon nanotubes that can be used to manufacture microwave absorbers for automotive radar sensors, and that can be injection molded using the one-step or two-step injection molding processes.

The present disclosure can be understood more readily by reference to the following detailed description of the disclosure and the Examples included therein. Aspects of the disclosure relate to thermoplastic compositions including: (a) a polycarbonate resin: (b) a poly (carbonate-siloxane) copolymer having a siloxane content of at least about 5 wt %; and (c) from about 0.15 wt % to about 4.5 wt % of a carbon nanotube filler. The carbon nanotubes have an average diameter of from about 8-12 nanometers (nm), a length of about 5 micron (μm) or less, a surface area of about 220 square meters per gram ($m^2$/gr) or higher, and a volume resistivity lower than about $10^{-2}$ Ohm·centimeters (Ohm·cm). The composition has a volume electrical resistivity of at least about 1.0E+06 Ohm·cm as determined in accordance with ASTM D257. A molded sample of the composition has a percent absorbed power measured in Transmission mode of at least about 60% when observed according to a Free Space method at frequencies from about 75 GHz to 110 GHz.

Before the present compounds, compositions, articles, systems, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting.

Various combinations of elements of this disclosure are encompassed by this disclosure, e.g., combinations of elements from dependent claims that depend upon the same independent claim.

Moreover, it is to be understood that unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; and the number or type of aspects described in the specification.

All publications mentioned herein are incorporated herein by reference to disclose and describe the methods and/or materials in connection with which the publications are cited.

Definitions

It is also to be understood that the terminology used herein is for the purpose of describing particular aspects only and is not intended to be limiting. As used in the specification and in the claims, the term "comprising" can include the aspects "consisting of" and "consisting essentially of." Unless defined otherwise, all technical and scientific terms used herein have the same meaning as commonly understood by one of ordinary skill in the art to which this disclosure belongs. In this specification and in the claims which follow, reference will be made to a number of terms which shall be defined herein.

As used in the specification and the appended claims, the singular forms "a," "an" and "the" include plural referents unless the context clearly dictates otherwise. Thus, for example, reference to "a polycarbonate resin" includes mixtures of two or more polycarbonate resins.

As used herein, the term "combination" is inclusive of blends, mixtures, alloys, reaction products, and the like.

Ranges can be expressed herein as from one value (first value) to another value (second value). When such a range is expressed, the range includes in some aspects one or both of the first value and the second value. Similarly, when values are expressed as approximations, by use of the antecedent 'about,' it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "about" and "at or about" mean that the amount or value in question can be the designated value, approximately the designated value, or about the same as the designated value. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Disclosed are the components to be used to prepare the compositions of the disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the disclosure. Thus, if there are a variety of additional steps that can be performed it is understood that each of these additional steps can be performed with any specific aspect or combination of aspects of the methods of the disclosure.

References in the specification and concluding claims to parts by weight of a particular element or component in a composition or article, denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent of a component, unless specifically stated to the contrary, is based on the total weight of the formulation or composition in which the component is included.

As used herein, the terms "number average molecular weight" or "$M_n$" can be used interchangeably, and refer to the statistical average molecular weight of all the polymer chains in the sample and is defined by the formula:

$$M_n = \frac{\sum N_i M_i}{\sum N_i},$$

where $M_i$ is the molecular weight of a chain and $N_i$ is the number of chains of that molecular weight. $M_n$ can be determined for polymers, e.g., polycarbonate polymers, by methods well known to a person having ordinary skill in the art using molecular weight standards, e.g. polycarbonate standards or polystyrene standards, preferably certified or traceable molecular weight standards.

As used herein, the terms "weight average molecular weight" or "Mw" can be used interchangeably, and are defined by the formula:

$$M_w = \frac{\sum N_i M_i^2}{\sum N_i M_i},$$

where $M_i$ is the molecular weight of a chain and $N_i$ is the number of chains of that molecular weight. Compared to $M_n$, $M_w$ takes into account the molecular weight of a given chain in determining contributions to the molecular weight average. Thus, the greater the molecular weight of a given chain, the more the chain contributes to the $M_w$. $M_w$ can be determined for polymers, e.g., polycarbonate polymers, by methods well known to a person having ordinary skill in the art using molecular weight standards, e.g., polycarbonate standards or polystyrene standards, preferably certified or traceable molecular weight standards.

As used herein, the terms "polydispersity index" or "PDI" can be used interchangeably, and are defined by the formula:

$$PDI = \frac{M_w}{M_n}.$$

The PDI has a value equal to or greater than 1, but as the polymer chains approach uniform chain length, the PDI approaches unity.

The terms "BisA," "BPA," or "bisphenol A," which can be used interchangeably, as used herein refers to a compound having a structure represented by the formula:

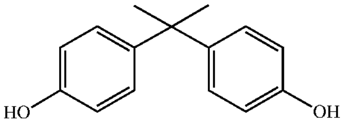 [SMILES: CC(C)(c1ccc(O)cc1)c1ccc(O)cc1]

BisA can also be referred to by the name 4,4'-(propane-2, 2-diyl)diphenol: p,p'-isopropylidenebisphenol; or 2,2-bis(4-hydroxyphenyl) propane. BisA has the CAS #80-05-7.

As used herein, "polycarbonate" refers to an oligomer or polymer including residues of one or more dihydroxy compounds, e.g., dihydroxy aromatic compounds, joined by carbonate linkages; it also encompasses homopolycarbonates, copolycarbonates, and (co) polyester carbonates.

The terms "residues" and "structural units", used in reference to the constituents of the polymers, are synonymous throughout the specification.

As used herein the terms "weight percent," "wt %," and "wt. %," which can be used interchangeably, indicate the percent by weight of a given component based on the total weight of the composition, unless otherwise specified. That is, unless otherwise specified, all wt % values are based on the total weight of the composition. It should be understood that the sum of wt % values for all components in a disclosed composition or formulation are equal to 100.

Unless otherwise stated to the contrary herein, all test standards are the most recent standard in effect at the time of filing this application.

Each of the materials disclosed herein are either commercially available and/or the methods for the production thereof are known to those of skill in the art.

It is understood that the compositions disclosed herein have certain functions. Disclosed herein are certain structural requirements for performing the disclosed functions and it is understood that there are a variety of structures that can perform the same function that are related to the disclosed structures, and that these structures will typically achieve the same result.

Thermoplastic Compositions

In some aspects the disclosure relates to thermoplastic compositions including a polycarbonate masterbatch containing a fixed loading of multi-wall carbon nanotubes, and a combination of different polycarbonate resins used to dilute the original masterbatch to form blends of varying concentrations of nanotubes. The carbon nanotubes are used to impart electrical conductivity and microwave interference properties to the composition. Carbon nanotubes are preferred over carbon powder, graphite or carbon fibers since they provide adequate microwave interference performance at relatively low loadings. Lower loadings of carbon, for example, would result in improvements to the ductility, impact strength, surface aesthetics, and flow of these materials under high shear rate conditions.

Other aspects of the disclosure relate to a component of an automotive radar sensor (e.g., plate, enclosure, cover). The component may be molded from a material including a polymer and carbon nanotubes as the microwave absorbing filler. The molded part has suitable design, average thickness, microwave absorption efficiency, absorption bandwidth, Shielding Effectiveness (SE), attenuation, electrical surface resistivity and electrical volume resistivity properties.

Further aspects of the disclosure include an article (e.g., radar sensor, camera, ECU, radar bracket) including a molded part including a microwave absorbing material (absorber). The article may have at least two openings to allow the transmission of microwave radiation between a transmitting antenna and a receiving antenna located in the printed circuit board of the sensor.

In some aspects, a thermoplastic composition includes: (a) a polycarbonate resin: (b) a poly (carbonate-siloxane) copolymer having a siloxane content of at least about 5 wt %; and (c) from about 0.15 wt % to about 4.5 wt % of a carbon nanotube filler. The composition has a volume electrical resistivity of at least about 1.0E+06 Ohm·centimeters (Ohm·cm) as determined in accordance with ASTM D257. A molded sample of the composition has a percent absorbed power measured in Transmission mode of at least about 60% when observed according to a Free Space method at frequencies from about 75 GHz to 110 GHz. The combined weight percent value of all components does not exceed 100 wt %, and all weight percent values are based on the total weight of the composition.

The polycarbonate resin includes in certain aspects a polycarbonate homopolymer, a polycarbonate copolymer different than the poly (carbonate-siloxane) copolymer in element (b), or a combination thereof.

Thermoplastic homopolymer polycarbonates are amorphous, clear and high performance polymers that exhibit inherent toughness, stiffness, transparency, and heat resistance. In some instances, however, a poor balance of some of the polymer's properties may restrict its use in certain end use applications. Polycarbonate resins for use in consumer electronics such as cell phones and laptop computers, for example, usually require a delicate balance between high flow and good impact strength and toughness. The use of polycarbonates of low molecular weight in these applications to achieve high flow in the molding of thin parts usually compromises the material's impact toughness and strength, especially in those cases when these materials are targeted for use in low temperature environments. It is in these specific cases that poly (carbonate-siloxane) copolymer resins are used to improve the physical properties of homopolymer polycarbonates.

Accordingly, in particular aspects the poly (carbonate-siloxane) ("PC-Si") copolymer has a siloxane content of from about 5 wt % to about 50 wt %. In further aspects the PC-Si copolymer has a siloxane content of from about 5 wt % to about 45 wt %, or from about 15 wt % to about 45 wt %. As used herein, "siloxane content" refers to poly (dimethylsiloxane).

In some aspects the composition includes from about 10 wt % to about 40 wt % of the poly (carbonate-siloxane) copolymer. The composition may have a total siloxane content of from about 1 wt % to about 20 wt %. In further aspects the composition has a total siloxane content of from about 2 wt % to about 18 wt %, or from about 3 wt % to about 15 wt %, or from about 4 wt % to about 12 wt %, or from about 5 wt % to about 10 wt %.

The poly (carbonate-siloxane) copolymers include carbonate units and siloxane units. The carbonate unit is a bisphenol A polycarbonate homopolymer, and the siloxane unit is an eugenol-terminated polydimethylsiloxane, with the block copolymer having the formula below:

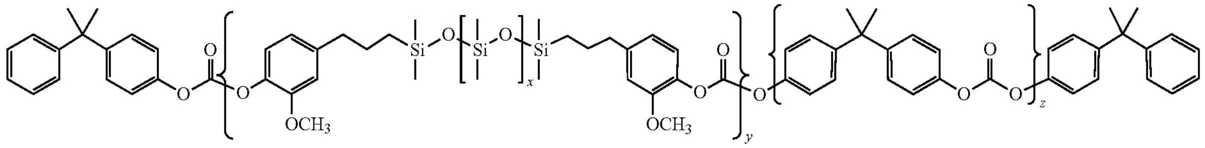

PC-Si copolymers can have a weight average molecular weight of between 20,000 and 45,000 g/mol as measured by gel permeation chromatography using a crosslinked styrene-divinyl benzene column, at a sample concentration of 1 milligram per milliliter, and as calibrated with bisphenol A polycarbonate standards.

Exemplary PC-Si copolymers include an opaque PC-Si copolymer resin (EXL 9030P), containing 20 wt % siloxane, which is available from SABIC. This PC-Si copolymer has a weight average molecular weight Mw of about 30,000 g/mol, whereas the siloxane component was a D45 eugenol-capped siloxane soft block for elastomeric resins. Silicone block lengths longer than D45 can result in compositions that have undesired haze and opacity, even when uniformly distributed in the polymer. Another suitable PC-Si copolymer available from SABIC has a 40 wt % siloxane content. The PC-Si copolymer resins offer a unique combination of flow, chemical resistance, hydrolytic stability, and low temperature ductility compared to polycarbonate homopolymers. In these copolymers, the elastomeric siloxane block forms nano-domains that are dispersed in the polycarbonate matrix. Some of the properties of these resins are affected by the nano-domain size and the dispersion quality of the siloxane segments. These copolymers can be prepared from a variety of monomers using different polymerization methods which have been described in some detail in the open literature. LEXAN™ resin EXL1414, for instance, is a medium flow, opaque injection molding grade used in applications requiring extreme low temperature (−40° C.) ductility combined with good processability and mold release properties.

Carbon-filled polycarbonates are used in applications requiring some level of electrical conductivity, especially in the conductive and electrostatic dissipation ranges, as well as some level of microwave interference at relatively high frequencies. Electrically conductive compositions including carbon powder and a polycarbonate or a mixture of polycarbonates as the matrix usually require relatively high loadings of carbon conductive filler to achieve the desired conductivity and microwave interference levels. Large carbon black loadings typically result in high viscosity (low flow) under injection molding conditions, and low impact strength and ductility, especially when these materials are used at temperatures below room temperature. It is in these specific cases that carbon nanotubes added in relatively low concentration can provide excellent flow, low-temperature impact and microwave shielding properties without adversely affecting the inherently good properties of polycarbonate resins.

Compositions according to aspects of the disclosure thus include a carbon nanotube filler. In other aspects the composition includes from about 0.15 wt % to about 1.5 wt % of the carbon nanotube filler. In particular aspects the composition includes from about 0.15 wt % to about 1.5 wt %, from about 0.2 wt % to about 1.5 wt %, from about 0.25 wt % to about 1.5 wt %, from about 0.2 wt % to about 4 wt %, from about 0.25 wt % to about 3.5 wt %, from about 0.3 wt % to about 3.0 wt %, from about 0.35 wt % to about 2.5 wt %, from about 0.4 wt % to about 2.0 wt %, or from about 0.5 wt % to about 1.5 wt %.

An exemplary CNT filler is available as a masterbatch as Plasticyl™ PC1501 (available from Nanocyl), and is a multi-wall carbon nanotube (MWCNT) polycarbonate masterbatch including 15 percent by weight of Nanocyl NC7000™ carbon nanotubes. The amount of PC-MWCNT masterbatch added to the composition may be varied from about 1 to about 50 weight percent, and the amount of unfilled polycarbonate resins may be varied from about 99 to about 50 weight percent. The resulting composition may include from about 0.1 weight % to about 5 weight % carbon nanotubes in the final formulation.

In certain aspects the carbon nanotube filler is incorporated into the composition in a form of a polycarbonate-based masterbatch including from about 5 wt % to about 30 wt % carbon nanotubes, or from about 5 wt % to about 25 wt % carbon nanotubes, or from about 10 wt % to about 20 wt % carbon nanotubes, or from about 11 wt % to about 19 wt % carbon nanotubes, or from about 12 wt % to about 18 wt % carbon nanotubes, or from about 13 wt % to about 17 wt % carbon nanotubes, or from about 14 wt % to about 16 wt % carbon nanotubes, or about 15 wt % carbon nanotubes.

Carbon nanotubes are preferred in aspects of the disclosure as compared to other forms of carbon such as carbon black. For example, as reported in International application PCT/IB2020/062593 (published as WO 2021/137192, the disclosure of which is incorporated herein in its entirety), a much higher carbon black content (up to 12 wt % or even higher) is generally required to achieve compositions having absorption levels comparable to those described in the present application. The higher carbon content required in conventional compositions has numerous drawbacks as compared to the present compositions, including but not limited to poor surface appearance, reduced flow and ductility properties, and higher cost.

In some aspects the carbon nanotubes have an average diameter of from about 8-12 nanometers (nm), a length of about 5 micron (μm) or less, a surface area of about 220 square meters per gram ($m^2$/gr) or higher, and a volume resistivity lower than about $10^{-2}$ Ohm·centimeters (Ohm·cm). In particular aspects the carbon nanotubes have an average diameter of from about 9 nm to about 11 nm, or about 10 nm. In further aspects the carbon nanotubes have a surface area of at least about 225 $m^2$/gr, or at least about 230 $m^2$/gr, or at least about 235 $m^2$/gr, or at least about 240 $m^2$/gr, or at least about 245 $m^2$/gr.

In certain aspects carbon nanotubes having the properties described herein provide the compositions with improved properties as compared to other types of carbon nanotubes. For example the Nanocyl NC7000™ carbon nanotubes included in the exemplary Plasticyl™ PC1501 masterbatch described herein have an average diameter of about 9.5 nm, an average length of about 1.5 micron, a BET surface area of from about 250-300 $m^2$/g, and a volume resistivity of about $10^{-4}$ Ohm·cm. These carbon nanotubes provided the compositions with the properties described herein.

It is expected that other types of carbon nanotubes will behave differently when added to microwave absorbing compositions. For example, the present inventors have found that carbon nanotubes offered by Hyperion Catalysis International must be used in larger amounts to achieve comparable absorption values as the carbon nanotubes according to aspects of the disclosure. The Hyperion carbon nanotubes have a BET surface area of about 240 $m^2$/g, an average diameter of about 10 nm, and an average length of about 10 micron. Other CNTs include FT9000 CNTS from CNano, which have an average diameter of about 10-15 nm and an average length of about 10 micron, and MR CNTs from Molecular Rebar®. which have an average diameter of about 10-15 nm and an average length of less than 1 micron. It is anticipated that these CNTs would produce different responses (rheological, physical, dielectric, etc.) when added to a polymer at the same loading In a specific aspect the carbon nanotube filler is present in an amount of between about 0.5 wt % and about 1.5 wt. %, and a molded sample of the composition has a percent absorbed power measured in Transmission mode of at least 75% when observed according to a Free Space method at a frequency of 77 GHz.

Thermoplastic compositions according to aspects of the disclosure thus include carbon nanotubes uniformly dispersed in a mixture of homopolymer polycarbonates and PC-Si copolymers. The soft, elastomeric siloxane block (e.g., Tg=−123° C.) of the PC-Si copolymer contributes to the low temperature impact, flow, weatherability and release properties of the material, while the hard, thermoplastic polycarbonate block (e.g., Tg=148° C.) contributes to the heat resistance and modulus performance of the copolymer.

In further aspects the carbon nanotube filler is present in an amount of between about 0.15 wt % and about 1.5 wt. %, and the composition has a volume electrical resistivity of at least about 1.2E+14 Ohm·cm as determined in accordance with ASTM D257.

In other aspects the composition has a notched Izod impact strength of at least 400 Joules per meter (J/m) at −30 degrees Celsius (° C.) as measured in accordance with ASTM D256. Compositions according to aspects of the disclosure may also have an unnotched Izod impact strength of at least 1800 J/m at −30° C. as measured in accordance with ASTM D256.

In some aspects the polycarbonate resin in element (a) includes at least two polycarbonate homopolymers, including a first polycarbonate homopolymer having a melt flow rate (MFR) of less than 15 grams per 10 minutes (g/10 min) and a second polycarbonate homopolymer having a MFR of greater than 15 g/10 min, wherein MFR is determined at a load of 1.20 kilogram (kg), and a temperature of 300° C. in accordance with ASTM D1238

The mixture of two polycarbonate homopolymers having different MFR values may allow for the optimization of the mechanical and rheological properties of the composition. The first polycarbonate homopolymer and the second polycarbonate homopolymer may be present in the composition in a ratio of from 1:3 to 3:1, or from about 1:2 to about 2:1, or from about 1:1.5 to about 1.5:1, or about 1:1.

In certain aspects the composition further includes at least one additional additive. The at least one additional additive may include, but is not limited to, an acid scavenger, an anti-drip agent, an antioxidant, an antistatic agent, a chain extender, a colorant, a de-molding agent, a flow promoter, a lubricant, a mold release agent, a plasticizer, a quenching agent, a flame retardant, a UV reflecting additive, an impact modifier, a blowing agent, a reinforcing agent, or a combination thereof.

Methods of Manufacture

The one or any foregoing components described herein may be first dry blended with each other, or dry blended with any combination of foregoing components, then fed into an extruder from one or multi-feeders, or separately fed into an extruder from one or multi-feeders. The fillers used in the disclosure may also be first processed into a masterbatch, then fed into an extruder. The components may be fed into the extruder from a throat hopper or any side feeders.

The extruders used in the disclosure may have a single screw, multiple screws, intermeshing co-rotating or counter rotating screws, non-intermeshing co-rotating or counter rotating screws, reciprocating screws, screws with pins, screws with screens, barrels with pins, rolls, rams, helical rotors, co-kneaders, disc-pack processors, various other types of extrusion equipment, or combinations including at least one of the foregoing.

The components may also be mixed together and then melt-blended to form the thermoplastic compositions. The melt blending of the components involves the use of shear force, extensional force, compressive force, ultrasonic energy, electromagnetic energy, thermal energy or combinations including at least one of the foregoing forces or forms of energy.

The barrel temperature on the extruder during compounding can be set at the temperature where at least a portion of the polymer has reached a temperature greater than or equal to about the melting temperature, if the resin is a semi-crystalline organic polymer, or the flow point (e.g., the glass transition temperature) if the resin is an amorphous resin.

The mixture including the foregoing mentioned components may be subject to multiple blending and forming steps if desirable. For example, the thermoplastic composition may first be extruded and formed into pellets. The pellets may then be fed into a molding machine where it may be formed into any desirable shape or product. Alternatively, the thermoplastic composition emanating from a single melt blender may be formed into sheets or strands and subjected to post-extrusion processes such as annealing, uniaxial or biaxial orientation.

The temperature of the melt in the present process may in some aspects be maintained as low as possible in order to avoid excessive thermal degradation of the components. In certain aspects the melt temperature is maintained between about 230° C. and about 350° C., although higher temperatures can be used provided that the residence time of the resin in the processing equipment is kept relatively short. In some aspects the melt processed composition exits processing equipment such as an extruder through small exit holes in a die. The resulting strands of molten resin may be cooled by passing the strands through a water bath. The cooled strands can be chopped into pellets for packaging and further handling.

Articles of Manufacture

In certain aspects, the present disclosure pertains to shaped, formed, or molded articles including the thermoplastic compositions. The thermoplastic compositions can be molded into useful shaped articles by a variety of means such as injection molding, extrusion, rotational molding, blow molding and thermoforming to form articles and structural components of, for example, an automotive radar sensor, including but not limited to a microwave absorber for a radar sensor. In a further aspect, the article is extrusion molded. In a still further aspect, the article is injection molded.

Various combinations of elements of this disclosure are encompassed by this disclosure, e.g., combinations of elements from dependent claims that depend upon the same independent claim.

ASPECTS OF THE DISCLOSURE

In various aspects, the present disclosure pertains to and includes at least the following aspects.

Aspect 1. A thermoplastic composition comprising, consisting of, or consisting essentially of:

(a) a polycarbonate resin;

(b) a poly (carbonate-siloxane) copolymer having a siloxane content of at least about 5 wt %; and (c) from about 0.15 wt % to about 4.5 wt % of a carbon nanotube filler, wherein the composition has a volume electrical resistivity of at least about 1.0E+06 Ohm·centimeters (Ohm·cm) as determined in accordance with ASTM D257, a molded sample of the composition has a percent absorbed power measured in Transmission mode of at least about 60% when observed according to a Free Space method at frequencies from about 75 GHz to 110 GHz, and the combined weight percent value of all components does not exceed 100 wt %, and all weight percent values are based on the total weight of the composition.

Aspect 2. The thermoplastic composition according to Aspect 1, wherein the polycarbonate resin comprises a polycarbonate homopolymer, a polycarbonate copolymer different than the poly (carbonate-siloxane) copolymer in element (b), or a combination thereof.

Aspect 3. The thermoplastic composition according to Aspect 1 or 2, wherein the poly (carbonate-siloxane) copolymer has a siloxane content of from about 5 wt % to about 50 wt %.

Aspect 4. The thermoplastic composition according to any of Aspects 1 to 3, wherein the composition comprises from about 10 wt % to about 40 wt % of the poly (carbonate-siloxane) copolymer.

Aspect 5. The thermoplastic composition according to any of Aspects 1 to 4, wherein the composition has a total siloxane content of from about 1 wt % to about 20 wt %.

Aspect 6. The thermoplastic composition according to any of Aspects 1 to 5, wherein the composition comprises from about 0.15 wt % to about 1.5 wt % of the carbon nanotube filler.

Aspect 7. The thermoplastic composition according to any of Aspects 1 to 6, wherein the carbon nanotube filler is present in an amount of between about 0.5 wt % and about 1.5 wt. %, and wherein a molded sample of the composition has a percent absorbed power measured in Transmission mode of at least 75% when observed according to a Free Space method at a frequency of 77 GHz.

Aspect 8. The thermoplastic composition according to any of Aspects 1 to 6, wherein the carbon nanotube filler is present in an amount of between about 0.15 wt % and about 1.5 wt. %, and wherein the composition has a volume electrical resistivity of at least about 1.2E+14 Ohm·cm as determined in accordance with ASTM D257.

Aspect 9. The thermoplastic composition according to any of Aspects 1 to 8, wherein the composition has a notched Izod impact strength of at least 400 Joules per meter (J/m) at −30 degrees Celsius (° C.) as measured in accordance with ASTM D256.

Aspect 10. The thermoplastic composition according to any of Aspects 1 to 9, wherein the polycarbonate resin in element (a) comprises at least two polycarbonate homopolymers, the at least two polycarbonate homopolymers comprising a first polycarbonate homopolymer having a melt flow rate (MFR) of less than 15 grams per 10 minutes (g/10 min) and a second polycarbonate homopolymer having a MFR of greater than 15 g/10 min, wherein MFR is determined at a load of 1.20 kilogram (kg), and a temperature of 300° C. in accordance with ASTM D1238.

Aspect 11. The thermoplastic composition according to Aspect 10, wherein the first polycarbonate homopolymer and the second polycarbonate homopolymer are present in the composition in a ratio of from 1:3 to 3:1.

Aspect 12. The thermoplastic composition according to any of Aspects 1 to 11, wherein the composition further comprises at least one additional additive.

Aspect 13. The thermoplastic composition according to Aspect 12, wherein the at least one additional additive comprises an acid scavenger, an anti-drip agent, an antioxidant, an antistatic agent, a chain extender, a colorant, a de-molding agent, a flow promoter, a lubricant, a mold release agent, a plasticizer, a quenching agent, a flame retardant, a UV reflecting additive, an impact modifier, a blowing agent, a reinforcing agent, or a combination thereof.

Aspect 14. The thermoplastic composition according to any of Aspects 1 to 13, wherein the carbon nanotubes have an average diameter of from about 8-12 nanometers (nm), a length of about 5 micron (μm) or less, a surface area of about 220 square meters per gram ($m^2$/gr) or higher, and a volume resistivity lower than about $10^{-2}$ Ohm·centimeters (Ohm·cm).

Aspect 15. The thermoplastic composition according to any of claims 1 to 6, wherein the carbon nanotube filler is incorporated into the composition in a form of a polycarbonate-based masterbatch comprising from about 10 wt % to about 20 wt % carbon nanotubes.

Aspect 16. An article comprising the thermoplastic composition according to any of Aspects 1 to 15.

Aspect 17. The article according to Aspect 16, wherein the article is a microwave absorber for a radar sensor.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric. Unless indicated otherwise, percentages referring to composition are in terms of wt %.

There are numerous variations and combinations of reaction conditions, e.g., component concentrations, desired solvents, solvent mixtures, temperatures, pressures and other reaction ranges and conditions that can be used to optimize the product purity and yield obtained from the described process. Only reasonable and routine experimentation will be required to optimize such process conditions.

Dielectric properties of the compositions described herein may be evaluated according to a Free Space Method. The Free Space Method includes a vector network analyzer, two antennae facing each other with a sample holder placed equidistant between them. The fundamental experimental quantities produced by the Free Space Method are referred to as Scattering parameters, or S-parameters, which are used to describe the input-output relationship between the different ports of an electric network in terms of amplitude and phase versus frequencies. The S-parameters are usually identified by a two-number subscript, with the first number in the subscript referring to the responding port, while the second number refers to the incident port. Thus, S21 means the response at port 2 due to a signal at port 1. The Scattering parameters are complex numbers having a real part and an imaginary part, and they describe the amount of microwave radiation that is either reflected off the sample or transmitted through the sample. The Scattering parameter S11 for Reflection, for example, represents a signal that originates in antenna 1 and that is received back at the same antenna after impinging on the sample and is reflected off. Similarly, the Scattering parameter S21 for Transmission represents a signal that originates in antenna 1 and is received by antenna 2 after being transmitted through the material under test. Scattering parameters for Reflection and Transmission that represent a signal that originates at antenna 2, S22 for Reflection and S12 for Transmission, can also be defined. The S-parameter matrix can be used to determine reflection coefficients and transmission gains from both sides of a two-port network for which four S-parameters, S11, S22, S21, and S12, as defined before, can be identified. A software is then used to convert the Scattering parameter output of the network analyzer to dielectric properties. Free-space measurement techniques provide a method for determining the dielectric permittivity and magnetic permeability of the magneto-dielectric material under test. These methods are contactless, that is the material under test does not make direct contact with any active component of the equipment involved in the measurement.

Figure 1B:
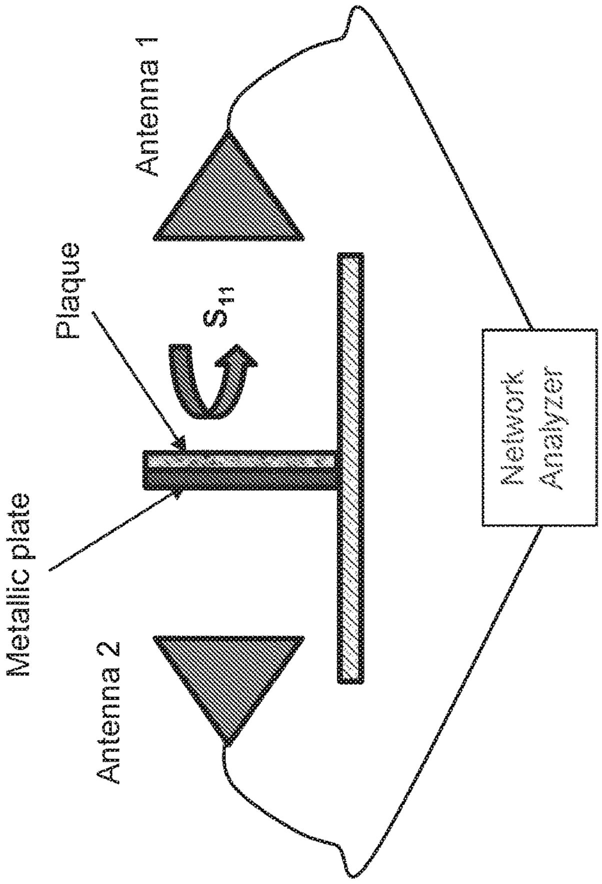

A schematic depiction of the apparatus used to determine the dielectric properties of the materials of this disclosure using the Free Space Method for un-backed and metal-backed samples is shown in FIGS. 1A and 1B, respectively. Injection molded plaques of 6 inch×8 inch×⅛ inch dimensions are used for these Free Space dielectric measurements.

Dielectric measurements using the Free Space Method can be performed in two different modes, the Transmission Mode and the Metal-backed Reflection Mode. The Transmission Mode of measurement measures three types of radiation: Absorption into the sample: Reflection off the sample; and Transmission through the sample. In the Metal-backed Reflection Mode of measurement, a metallic plate (stainless steel, aluminum, etc.) is placed between the material under test and the receiving antenna so transmission through the sample is completely suppressed, and only microwave Absorption into the material and microwave Reflection off the material can be evaluated. As the combination of the two antennae in Transmission mode can only measure the Scattering parameter for Reflection, S11, and the Scattering parameter for Transmission, S21, the amount (in percent) of radiation absorbed by the material under test is calculated as the difference between the total energy impinging on the sample (or 100%) and the sum of the amount (in percent) of radiation transmitted through the sample (measured from S21, and reaching the receiving antenna) and reflected off the sample (measured from S11, and returning back to the emitting antenna). In many applications, it is desirable to maximize percent Absorbed power, and to minimize percent Reflected power and percent Transmitted power when measurements are made using the Transmission mode. There are several dielectric properties that radar designers consider when selecting materials for microwave radar interference applications. Complex permittivity (real and imaginary parts), amount of radiation Absorbed, Reflected or Transmitted by the material, Shielding Effectiveness, Reflection Loss, and Attenuation are only some of the material properties of interest for the manufacture of plastic components for radar sensor applications. Frequency of the incoming radiation and material thickness are also important when trapping microwave energy that if not eliminated or minimized would interfere with the normal operation of the automotive electronic sensors.

The PC-MWCNT masterbatch used in the compositions described herein were diluted with different amounts of fresh, unfilled polycarbonate grades of different properties. The two homopolymer polycarbonate resins used in the compositions were SABIC's LEXAN™ 105, a 100-grade linear, general purpose polycarbonate homopolymer powder, and ML5221-111N, a linear, high flow polycarbonate homopolymer used in the injection molding of thin-wall applications. The mixture of these two polycarbonates in different ratios allowed for the optimization of the mechanical and rheological properties of the composition. The ratio of Polycarbonate 105-111N to Polycarbonate ML5221-111N was maintained at 1:1 for these compositions. Specific components used in the compositions described herein are listed in Table 1:

TABLE 1

Components Used in Compositions

| Component | Description | Source |
|---|---|---|
| PC (MB) | General PC from CNT Masterbatch Plasticyl ™ PC1501 | Nanocyl |
| PC1 | PC 105-111N | SABIC |
| PC2 | PC ML5221-111N | SABIC |
| PC-Si (20%) | Polycarbonate-siloxane copolymer, 20 wt % siloxane content | SABIC |
| PC-Si (40%) | Polycarbonate-siloxane copolymer, 40 wt % siloxane content | SABIC |
| AOx | Antioxidant, Irganox 1076 | BASF |
| Stab | Phosphite processing stabilizer, Irgafos 168 | BASF |
| CNT | CNTs from CNT Masterbatch Plasticyl ™ PC1501 | Nanocyl |

Example and comparative compositions including a PC-Si copolymer having a siloxane content of 20 wt % are listed in Table 2A; properties of the compositions are shown in Table 2B:

TABLE 2A

PC-Si (20%) Compositions

| Component | E1.1 | E1.2 | E1.3 | E1.4 | C1 |
|---|---|---|---|---|---|
| PC (MB) | 5.66 | 11.34 | 17.0 | 22.66 | 28.34 |
| PC1 | 33.97 | 30.63 | 27.3 | 23.97 | 20.63 |
| PC2 | 33.97 | 30.63 | 27.3 | 23.97 | 20.63 |
| PC-Si (20%) | 25 | 25 | 25 | 25 | 25 |
| AOx | 0.2 | 0.2 | 0.2 | 0.2 | 0.2 |
| Stab | 0.2 | 0.2 | 0.2 | 0.2 | 0.2 |
| CNT | 1.0 | 2.0 | 3.0 | 4.0 | 5.0 |
| Total: | 100 | 100 | 100 | 100 | 100 |

TABLE 2B

Properties of Table 2A Compositions

| Property | E1.1 | E1.2 | E1.3 | E1.4 | C1 |
|---|---|---|---|---|---|
| ε' | 7.03 | 10.32 | 13.58 | 16.78 | 20.49 |
| ε" | 1.79 | 3.99 | 6.73 | 9.75 | 13.57 |
| ε"/ε' (tan δ) | 0.255 | 0.386 | 0.496 | 0.581 | 0.662 |
| Attenuation Constant (dB/cm) | −47.0 | −85.4 | −124.4 | −160.5 | −200.1 |
| Total Shielding Effectiveness (dB) | 16.3 | 29.0 | 42.1 | 53.8 | 65.3 |
| % Power in Trans (Reflected) | 18.2 | 28.1 | 35.9 | 40.4 | 47.6 |
| % Power in Trans (Absorbed) | 79.5 | 71.8 | 64.1 | 59.6 | 52.4 |
| % Power in Trans (Transmitted) | 2.3 | 0.1 | 0.0 | 0.0 | 0.0 |
| Volume Resistivity (Avg) (Ohm · cm) | 3.56E+14 | 1.04E+12 | 5.72E+07 | 7.37E+05 | 1.36E+05 |
| Viscosity @5,000 1/s (Pa · s) | 140.3 | 123.2 | 107.2 | 96.5 | 87.2 |

Example and comparative compositions including a PC-Si copolymer having a siloxane content of 40 wt % are listed in Table 3A; properties of the compositions are shown in Table 3B:

TABLE 3A

| PC-Si (40%) Compositions | | | | | |
|---|---|---|---|---|---|
| Component | E2.1 | E2.2 | E2.3 | E2.4 | C2 |
| PC (MB) | 5.66 | 11.34 | 17.0 | 22.66 | 28.34 |
| PC1 | 33.97 | 30.63 | 27.3 | 23.97 | 20.63 |
| PC2 | 33.97 | 30.63 | 27.3 | 23.97 | 20.63 |
| PC-Si (40%) | 25 | 25 | 25 | 25 | 25 |
| AOx | 0.2 | 0.2 | 0.2 | 0.2 | 0.2 |
| Stab | 0.2 | 0.2 | 0.2 | 0.2 | 0.2 |
| CNT | 1.0 | 2.0 | 3.0 | 4.0 | 5.0 |
| Total: | 100 | 100 | 100 | 100 | 100 |

TABLE 3B

| Properties of Table 3A Compositions | | | | | |
|---|---|---|---|---|---|
| Property | E2.1 | E2.2 | E2.3 | E2.4 | C2 |
| ε' | 6.85 | 9.62 | 13.42 | 16.62 | 16.01 |
| ε'' | 1.72 | 3.74 | 6.75 | 9.48 | 11.68 |
| ε''/ε' (tan δ) | 0.251 | 0.389 | 0.503 | 0.570 | 0.730 |
| Attenuation Constant (dB/cm) | −45.6 | −82.9 | −125.3 | −157.0 | −193.3 |
| Total Shielding Effectiveness (dB) | 16.0 | 29.0 | 42.5 | 52.9 | 62.1 |
| % Power in Trans (Reflected) | 17.1 | 27.5 | 36.5 | 38.4 | 40.1 |
| % Power in Trans (Absorbed) | 80.4 | 72.4 | 63.5 | 61.6 | 59.9 |
| % Power in Trans (Transmitted) | 2.5 | 0.1 | 0.0 | 0.0 | 0.0 |
| Volume Resistivity (Avg) (Ohm · cm) | 6.05E+14 | 4.15E+12 | 2.03E+08 | 5.98E+06 | 6.06E+05 |
| Viscosity @5,000 1/s (Pa · s) | 127.8 | 109.7 | 96 | 86.7 | 81.7 |

Example and comparative compositions including a PC-Si copolymer including 20 wt % siloxane and from 0.10 wt % to 1.0 wt % CNTs are listed in Table 4A; properties of the compositions are shown in Table 4B:

TABLE 4A

| PC-Si (20%) Compositions (Low CNT Levels) | | | | | |
|---|---|---|---|---|---|
| Component | C3 | E3.1 | E3.2 | E3.3 | E3.4 |
| PC (MB) | 0.56 | 1.41 | 2.82 | 4.25 | 5.66 |
| PC1 | 36.97 | 36.47 | 35.64 | 34.8 | 33.97 |
| PC2 | 36.97 | 36.47 | 35.64 | 34.8 | 33.97 |
| PC-Si (20%) | 25 | 25 | 25 | 25 | 25 |
| AOx | 0.2 | 0.2 | 0.2 | 0.2 | 0.2 |
| Stab | 0.2 | 0.2 | 0.2 | 0.2 | 0.2 |
| CNT | 0.10 | 0.25 | 0.50 | 0.75 | 1.0 |
| Total: | 100 | 100 | 100 | 100 | 100 |

TABLE 4B

| Properties of Table 4A Compositions | | | | | |
|---|---|---|---|---|---|
| Property | C3 | E3.1 | E3.2 | E3.3 | E3.4 |
| ε' | 3.02 | 3.72 | 4.46 | 5.74 | 6.52 |
| ε" | 0.12 | 0.40 | 0.76 | 1.43 | 1.74 |
| ε"/ε' (tan δ) | 0.038 | 0.109 | 0.170 | 0.248 | 0.267 |
| Attenuation Constant (dB/cm) | −4.7 | −14.7 | −25.0 | −41.3 | −47.4 |
| Total Shielding Effectiveness (dB) | 1.9 | 5.8 | 9.8 | 15.3 | 18.2 |
| % Power in Trans (Reflected) | 5.4 | 13.9 | 17.6 | 20.7 | 24.1 |
| % Power in Trans (Absorbed) | 29.6 | 60.0 | 71.8 | 76.3 | 74.4 |
| % Power in Trans (Transmitted) | 65.0 | 26.1 | 10.6 | 3.0 | 1.5 |
| Volume Resistivity (Avg) (Ohm · cm) | 1.09E+14 | 6.52E+14 | 1.29E+14 | 2.84E+14 | 2.31E+14 |
| Surface Resistivity (Avg) (Ohm/sq) | 1.44E+13 | 8.68E+12 | 1.01E+13 | 3.63E+13 | 3.04E+13 |
| NII (−30 ° C.) (J/m) | 531 | 537 | 547 | 517 | 441 |
| UNII (−30 ° C.) (J/m) | 2090 | 1880 | 2190 | 2550 | 2650 |

All the dielectric properties shown in Tables 2B, 3B and 4B were evaluated at 77 GHz frequency, which is a characteristic frequency used in the design of long-range radar sensors for automotive applications. Various properties of the compositions in Tables 2A-4B are graphically illustrated in the figures. FIGS. 2A, 2B, 4A, 4B, 5A, 5B, 6A and 6B illustrate properties of the compositions of Table 2A including the PC-Si copolymer having a 20 wt % siloxane content. FIGS. 3A, 3B, 4A, 4B, 5A, 5B, 6A and 6B illustrate properties of the compositions of Table 3A including the PC-Si copolymer having a 40 wt % siloxane content. FIGS. 7A, 7B, 8A-8E, and 9A-9E illustrate properties of the compositions of Table 4A including the PC-Si copolymer having a 20 wt % siloxane content and lower CNT content.

Figure 2A:
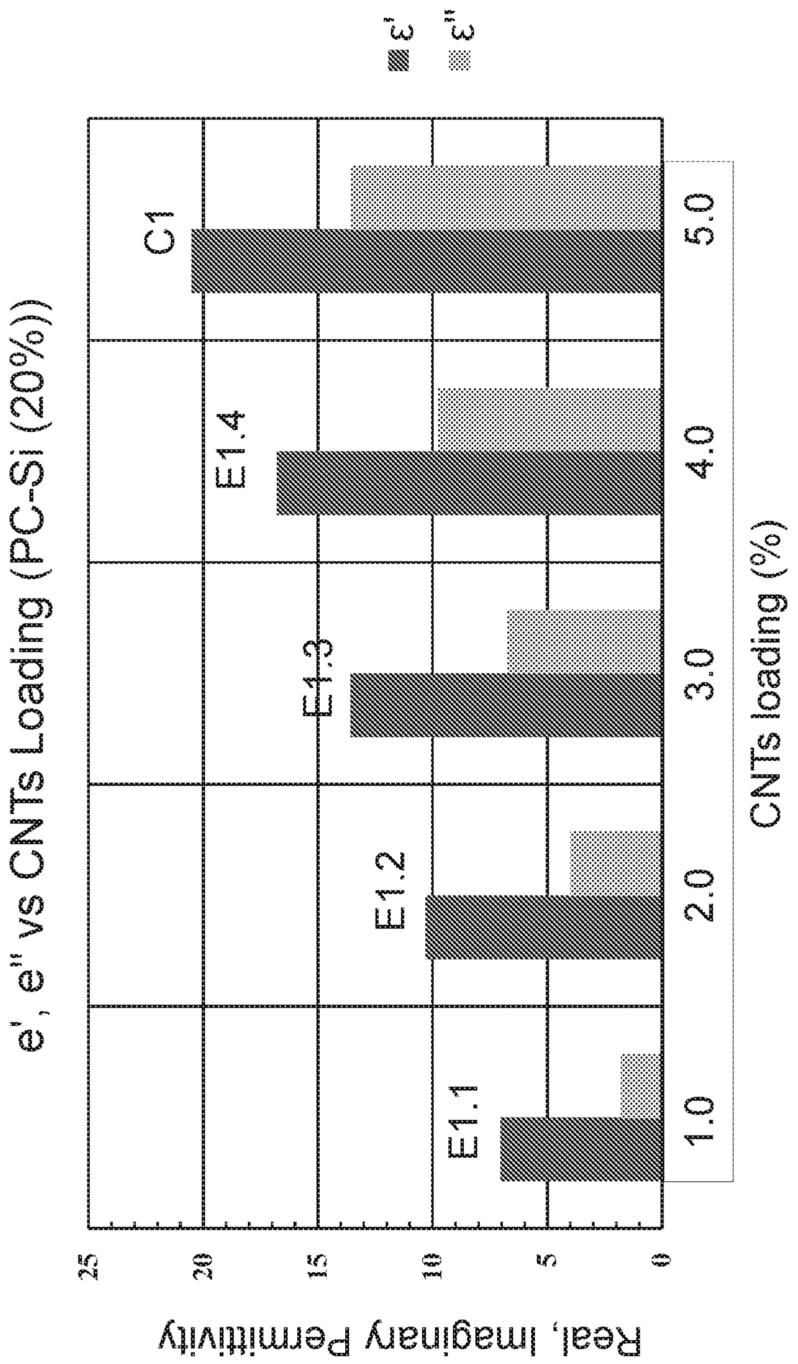
FIG. 2A is a graph illustrating permittivity (real and imaginary parts) as a function of CNT loading observed at a 77 GHz frequency for example and comparative compositions including a polycarbonate-siloxane copolymer having a 20% siloxane content according to aspects of the disclosure.
Figure 2B:
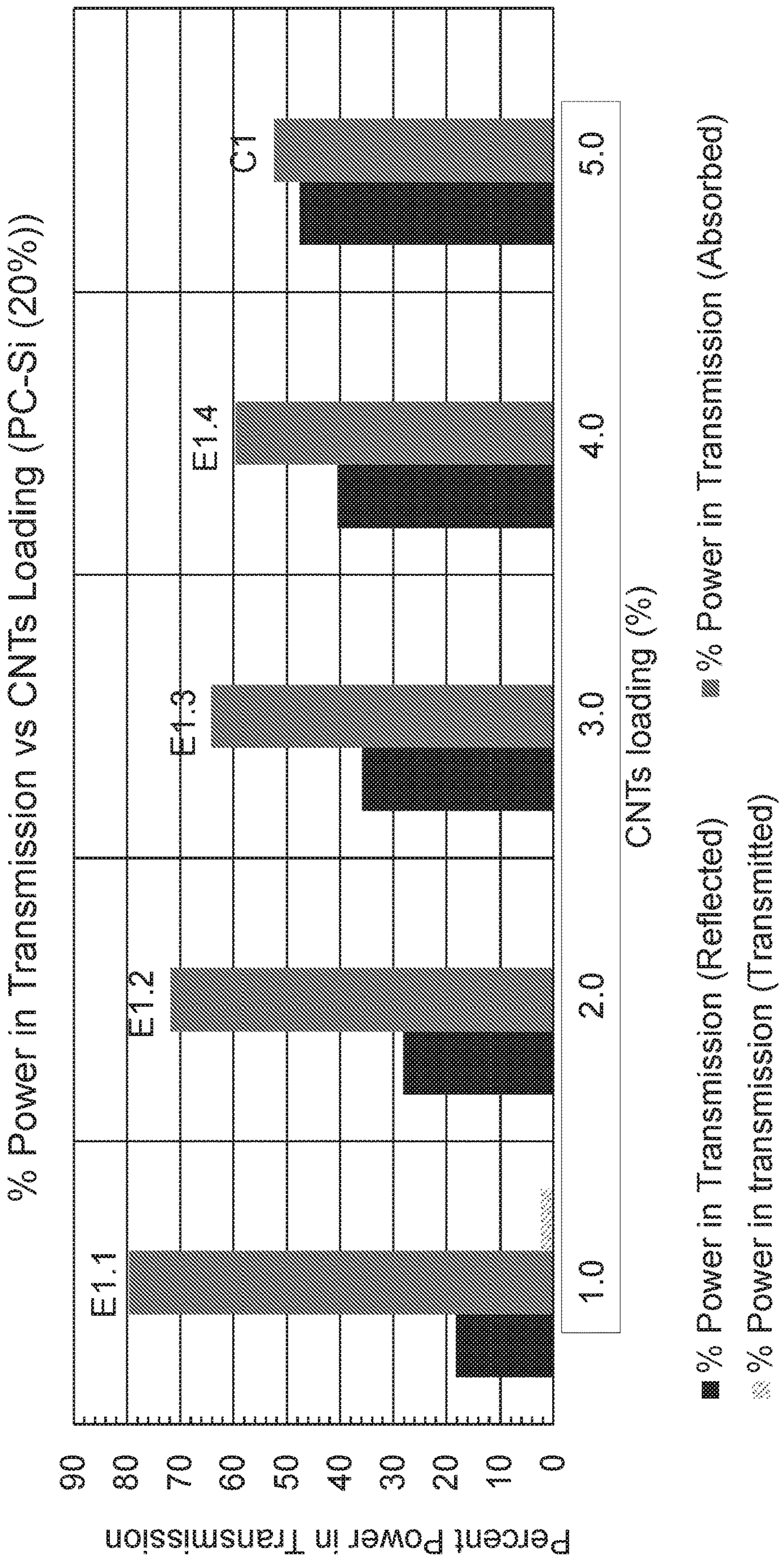
FIG. 2B is a graph illustrating percent power in transmission mode as a function of CNT loading observed at 77 GHz frequency for example and comparative compositions including a polycarbonate-siloxane copolymer having a 20% siloxane content according to aspects of the disclosure.

Specifically, FIG. 2A and Table 2B show the dielectric properties of E1.1-E1.4 and C1 which include PC-Si copolymer (20 wt % siloxane) and CNT loadings between 1 wt % and 5 wt % when measured at 77 GHz frequency using the Free Space method. These results show that the real and imaginary parts of the complex dielectric permittivity, ε' and ε", both increased as the concentration of carbon nanotubes in the formulation increased. As shown in Table 2B, the Dissipation Factor, (ε"/ε') or tan delta, also followed the same trend. The Attenuation Constant varied between about −40 and −210 dB/cm, and the Total Shielding Effectiveness was between about 12 and 70 dB when observed at a frequency of 77 GHz. As further shown in Table 2B and FIG. 2B, the Percent Absorbed Power measured in Transmission mode varied between about 50 and 80%, whereas the Percent Reflected Power measured in Transmission mode varied between about 15 and 50% when observed at 77 GHz of frequency. The Percent Transmitted Power measured in Transmission mode was about 2% or lower for the compositions investigated. The Percent Reflected Power increased, and the Percent Transmitted Power decreased as the materials became more electrically conducting (lower volume resistivity).

From measurements of ε' and ε" observed at 67 GHz on a 3.080 millimeter (mm) thick plaque of a pure homopolymer Polycarbonate resin with no carbon filler, 3.03 and 0.0012, respectively, the calculated Percent Transmission power, Percent Reflection power, and Percent Absorption power of the pure resin at 67 GHz were 76.5%, 23.3%, and 0.2%, respectively. From these results, it can be speculated that the maximum Percent Absorbed power in Transmission mode of the compositions of Table 2A will occur at a CNT content of about 1 wt % or lower.

Figure 3A:
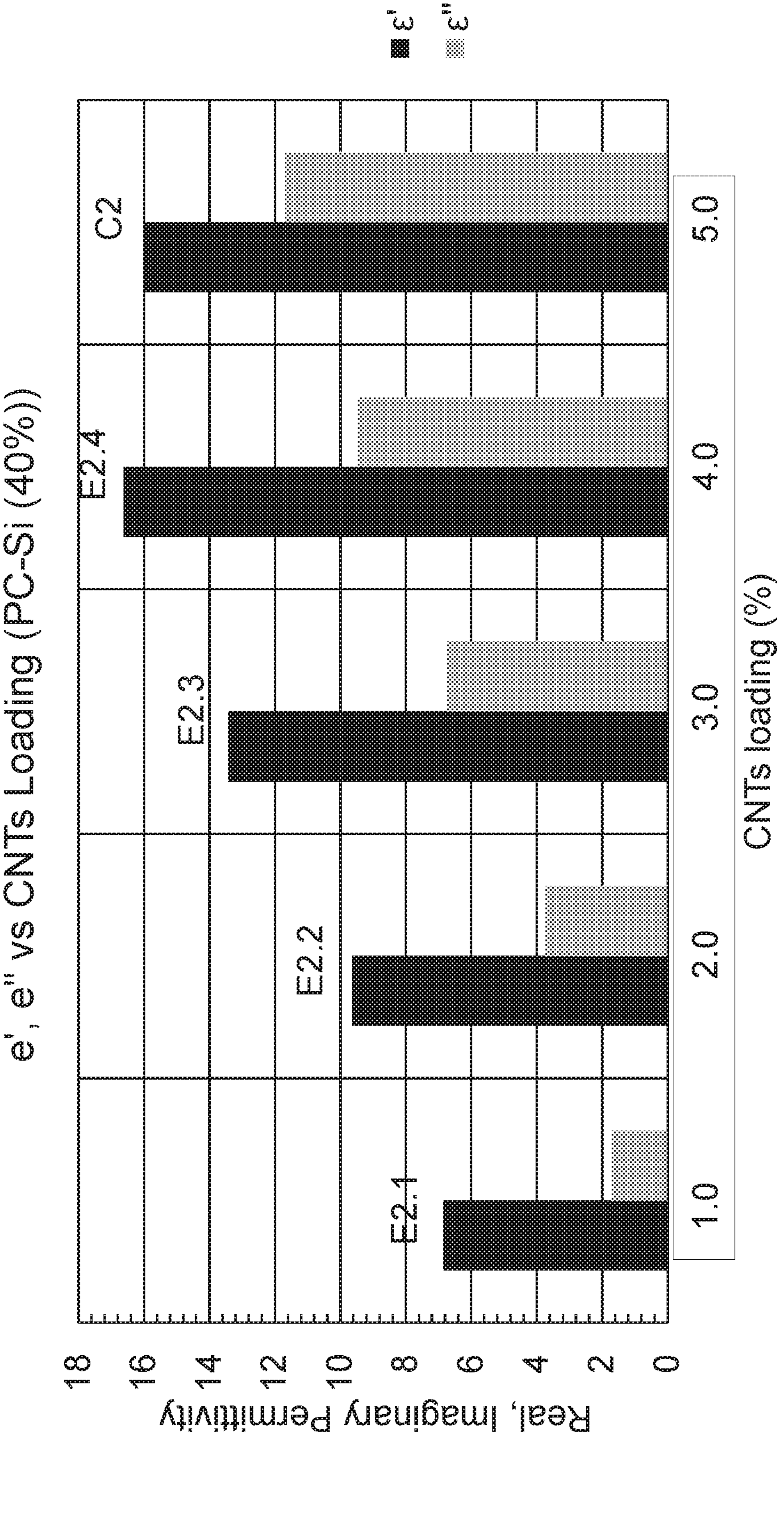
FIG. 3A is a graph illustrating permittivity (real and imaginary parts) as a function of CNT loading observed at a 77 GHz frequency for example and comparative compositions including a polycarbonate-siloxane copolymer having a 40% siloxane content according to aspects of the disclosure.
Figure 3B:
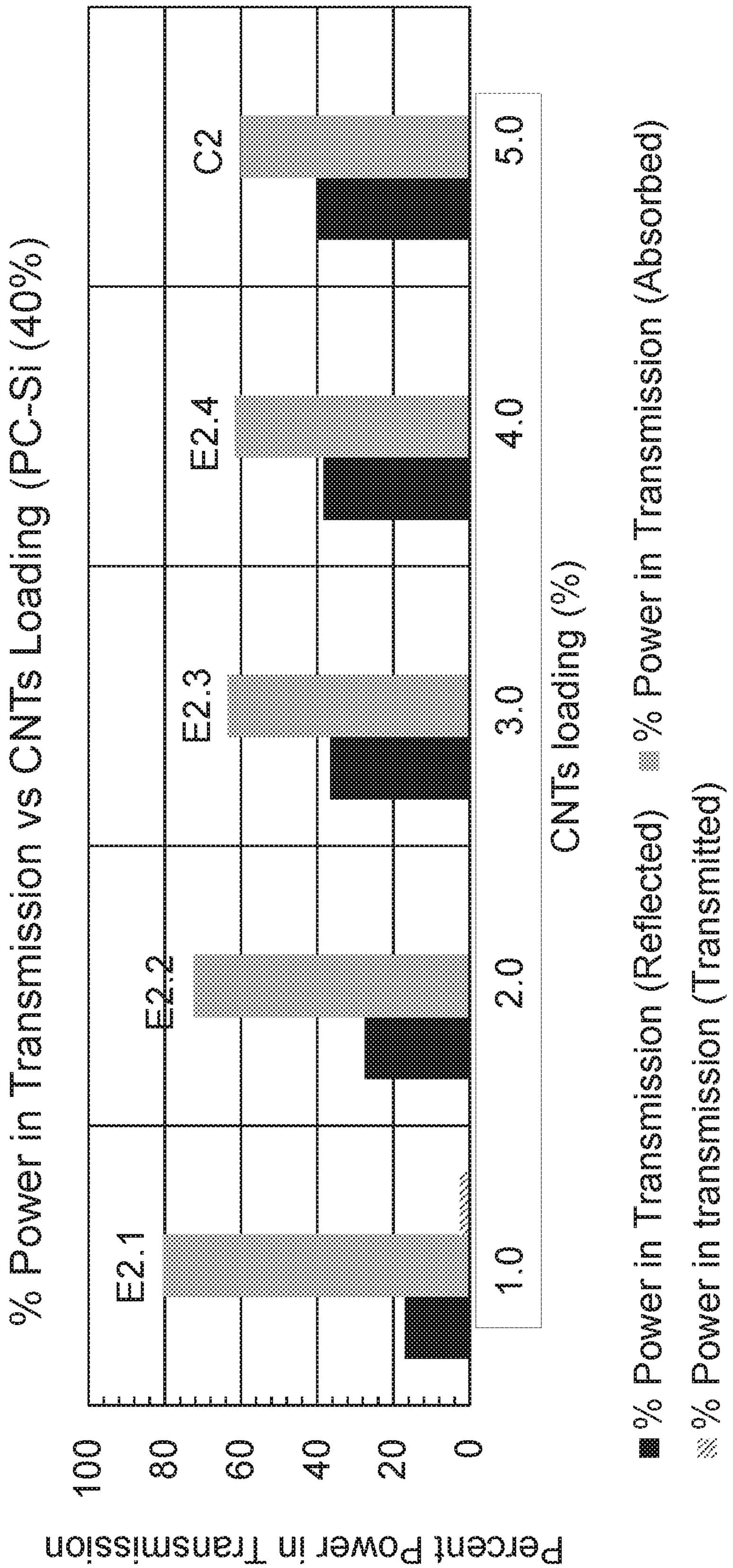
FIG. 3B is a graph illustrating percent power in transmission mode as a function of CNT loading observed at 77 GHz frequency for example and comparative compositions including a polycarbonate-siloxane copolymer having a 40% siloxane content according to aspects of the disclosure.
Figure 4A:
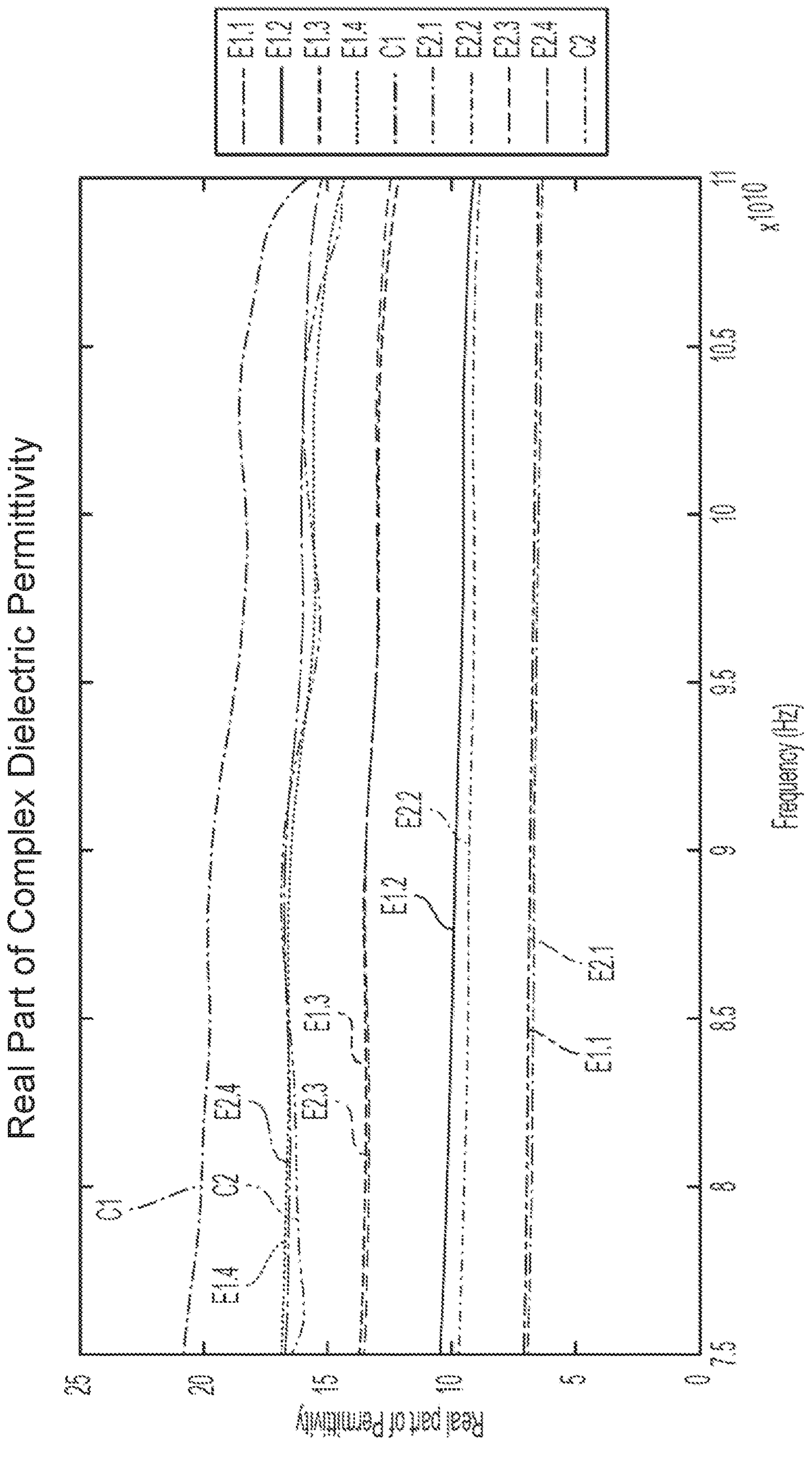
FIG. 4A is a graph illustrating the real part of the complex dielectric permittivity as a function of frequency in the W-band (75-110 GHz) for example and comparative compositions according to aspects of the disclosure.
Figure 4B:
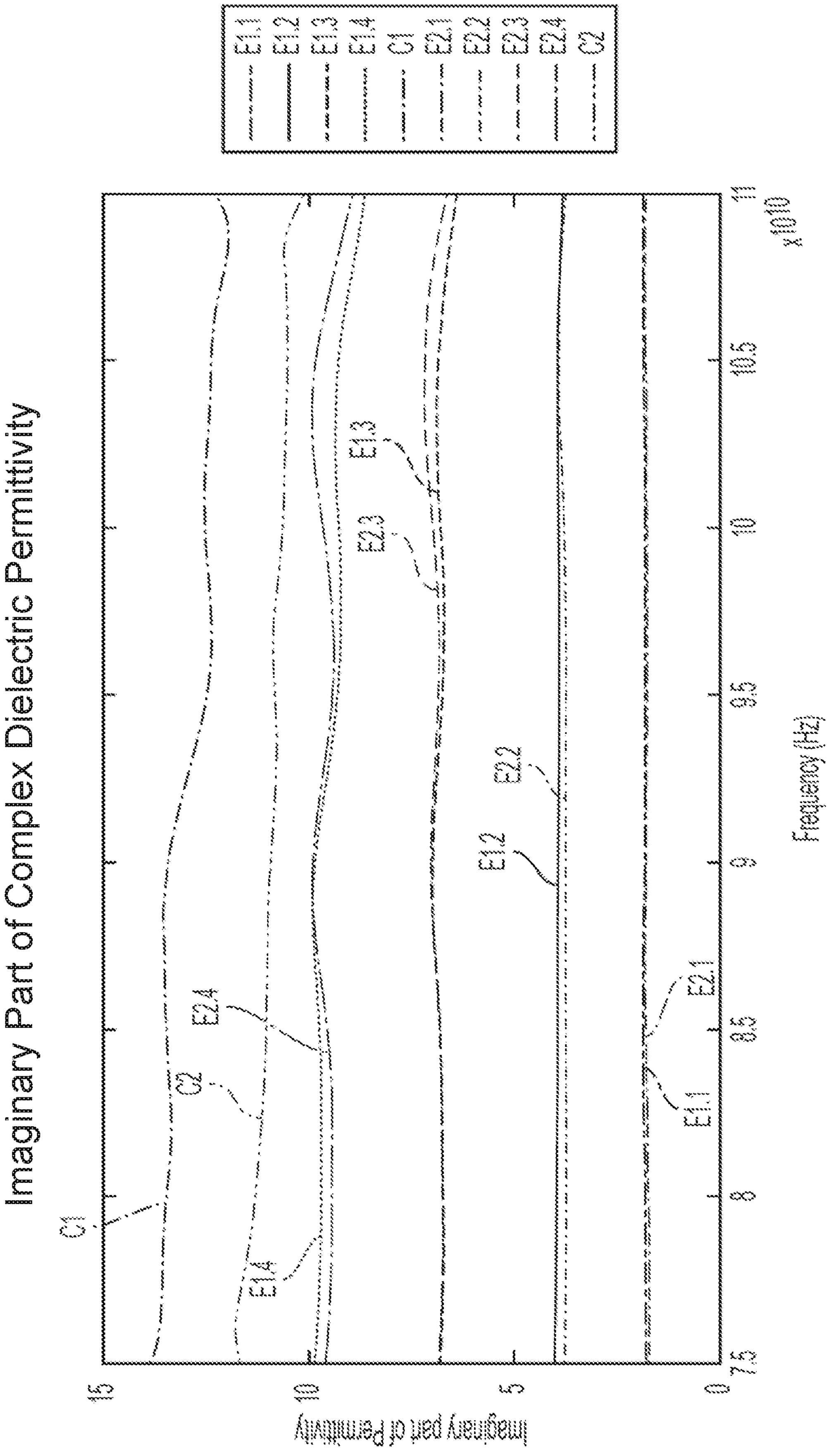
FIG. 4B is a graph illustrating the imaginary part of the complex dielectric permittivity as a function of frequency in the W-band (75-110 GHz) for example and comparative compositions according to aspects of the disclosure.
Figure 5A:
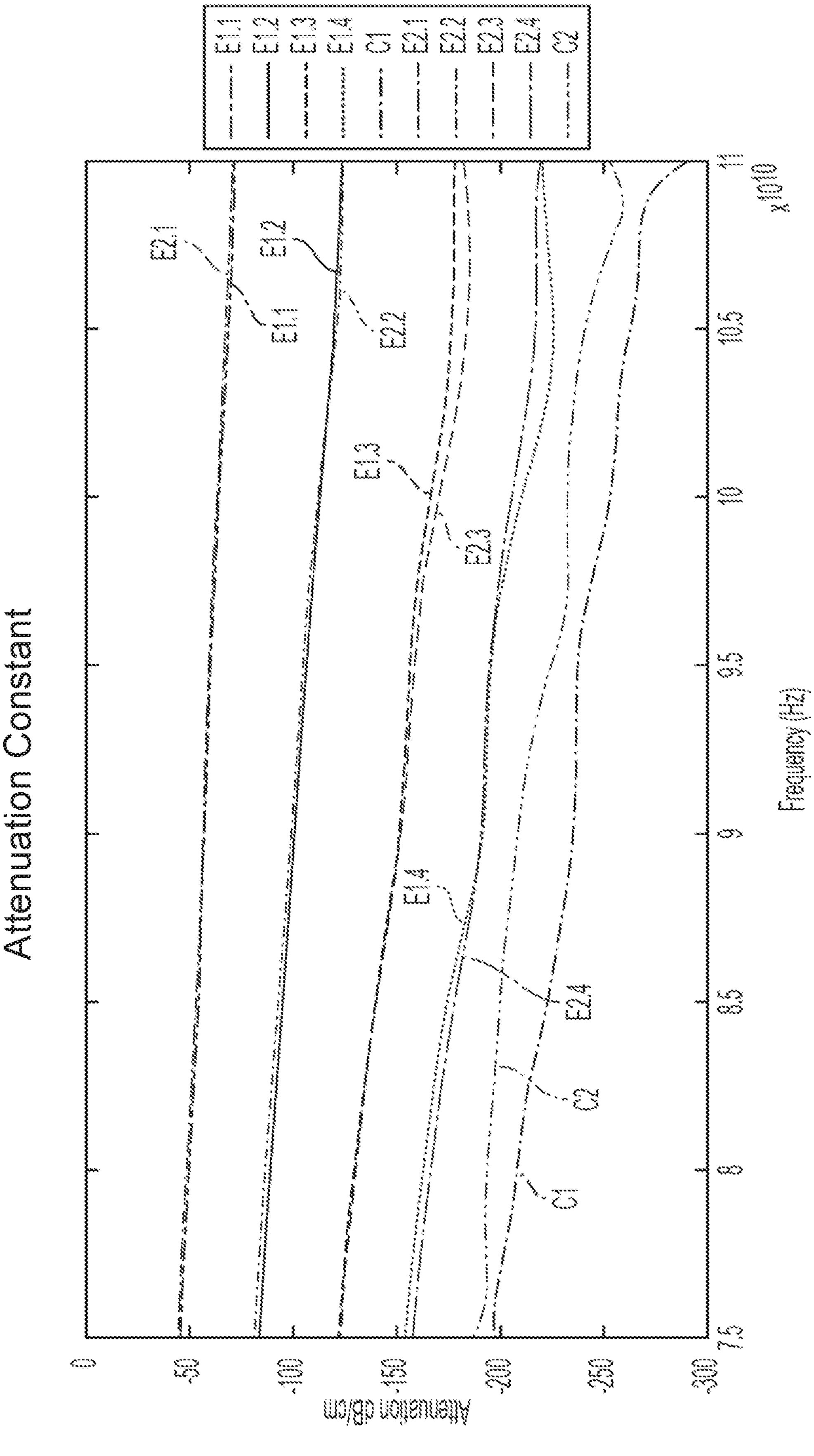
FIG. 5A is a graph illustrating attenuation constant as a function of frequency in the W-band (75-110 GHz) for example and comparative compositions according to aspects of the disclosure.
Figure 5B:
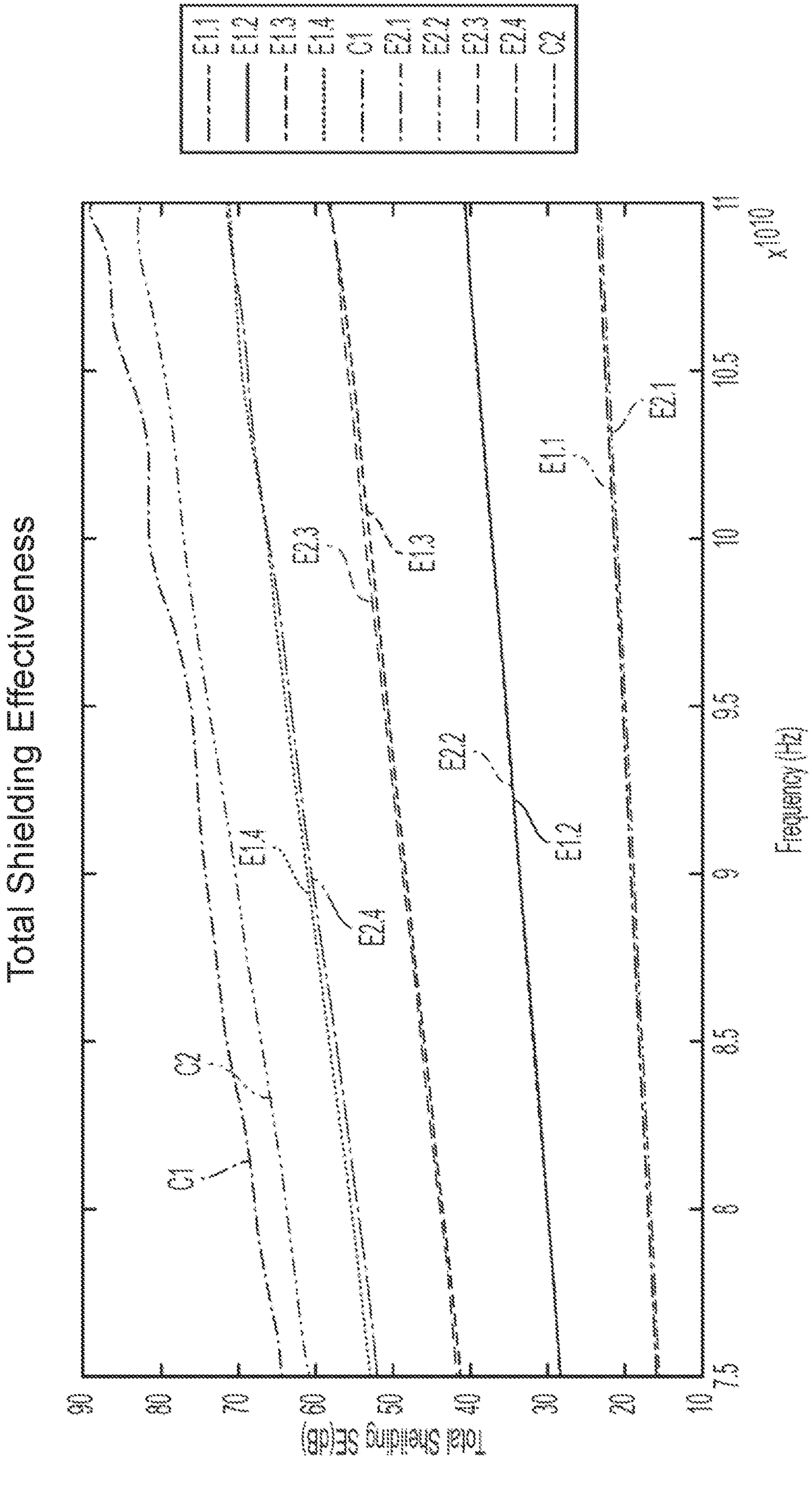
FIG. 5B is a graph illustrating total shielding effectiveness as a function of frequency in the W-band (75-110 GHz) for example and comparative compositions according to aspects of the disclosure.
Figure 6A:
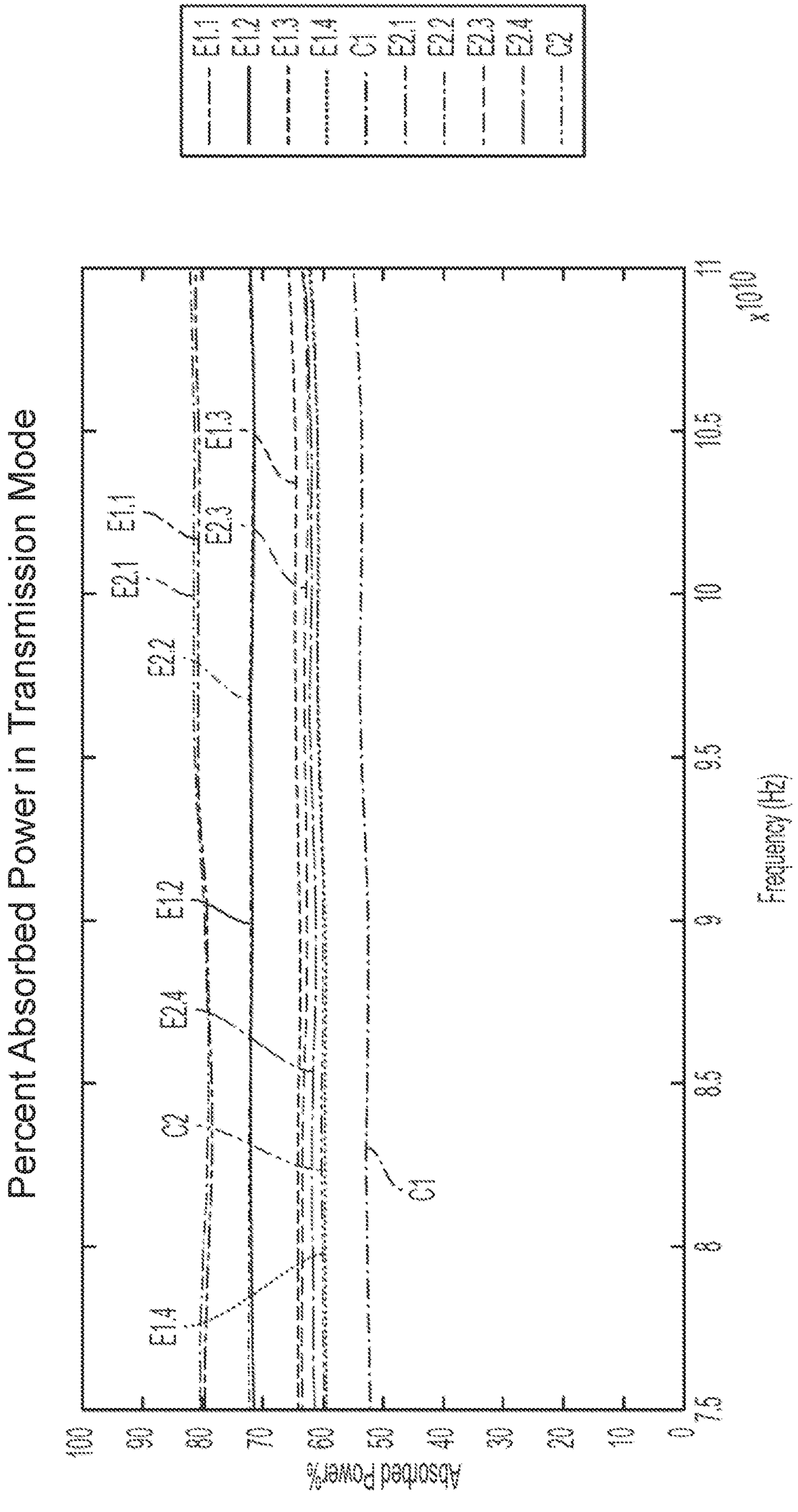
FIG. 6A is a graph illustrating percent absorbed power in transmission mode as a function of frequency in the W-band (75-110 GHz) for example and comparative compositions according to aspects of the disclosure.
Figure 6B:
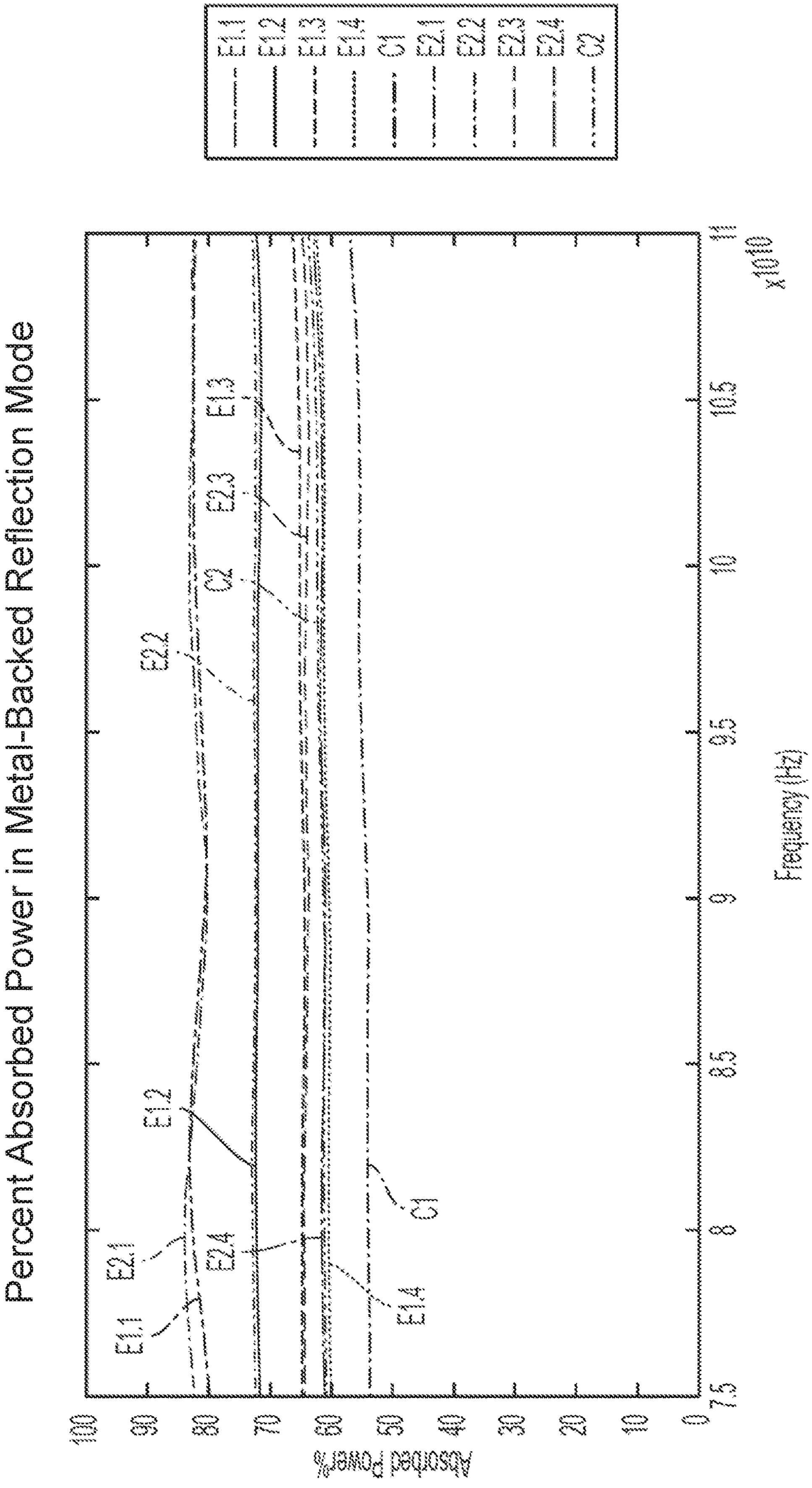
FIG. 6B is a graph illustrating percent absorbed power in metal-backed reflection mode as a function of frequency in the W-band (75-110 GHZ) for example and comparative compositions according to aspects of the disclosure.
Figure 7A:
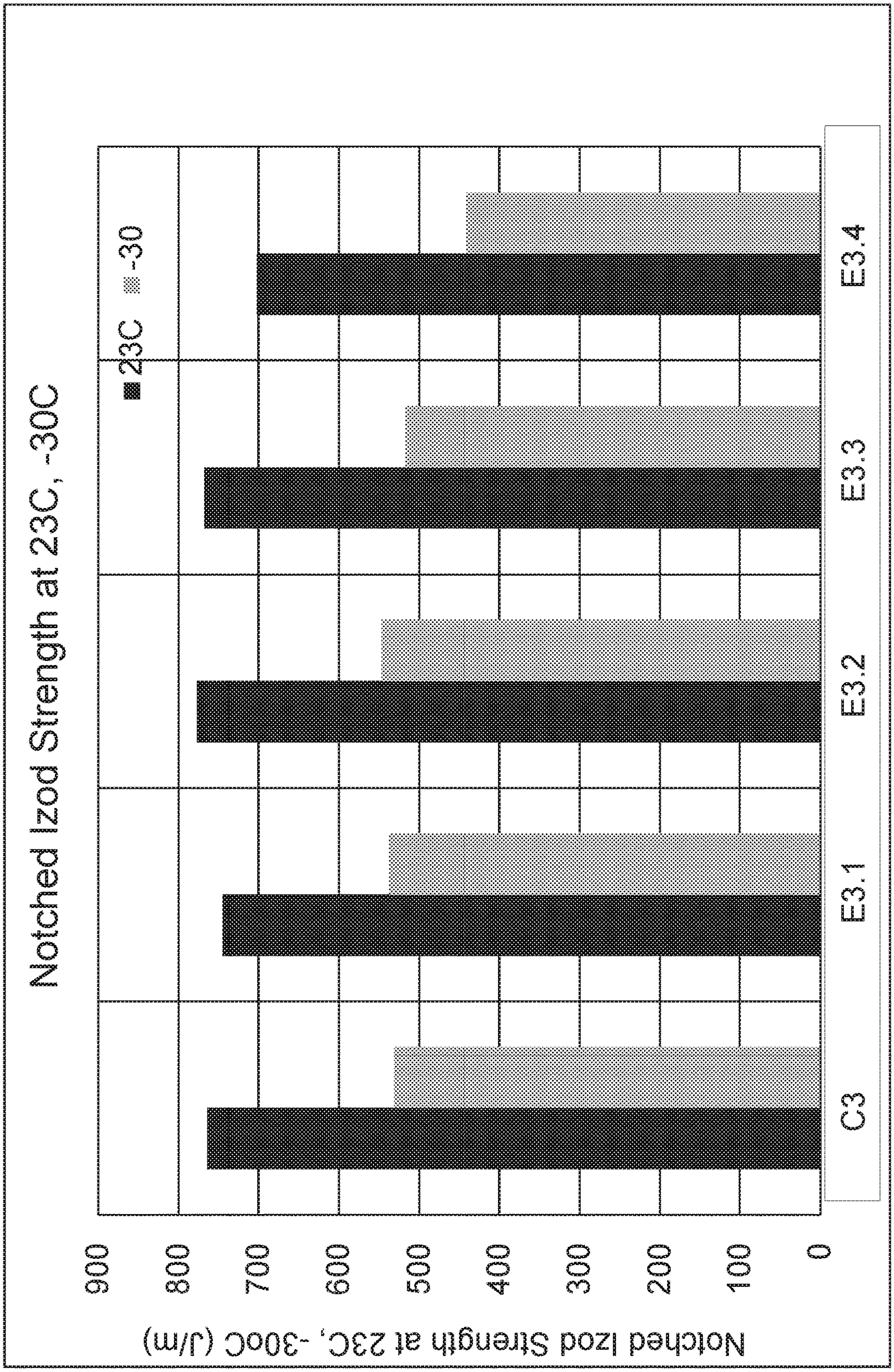
FIG. 7A is a graph illustrating notched Izod impact strength at 23° C. and −30° C. for example and comparative compositions according to aspects of the disclosure.
Figure 7B:
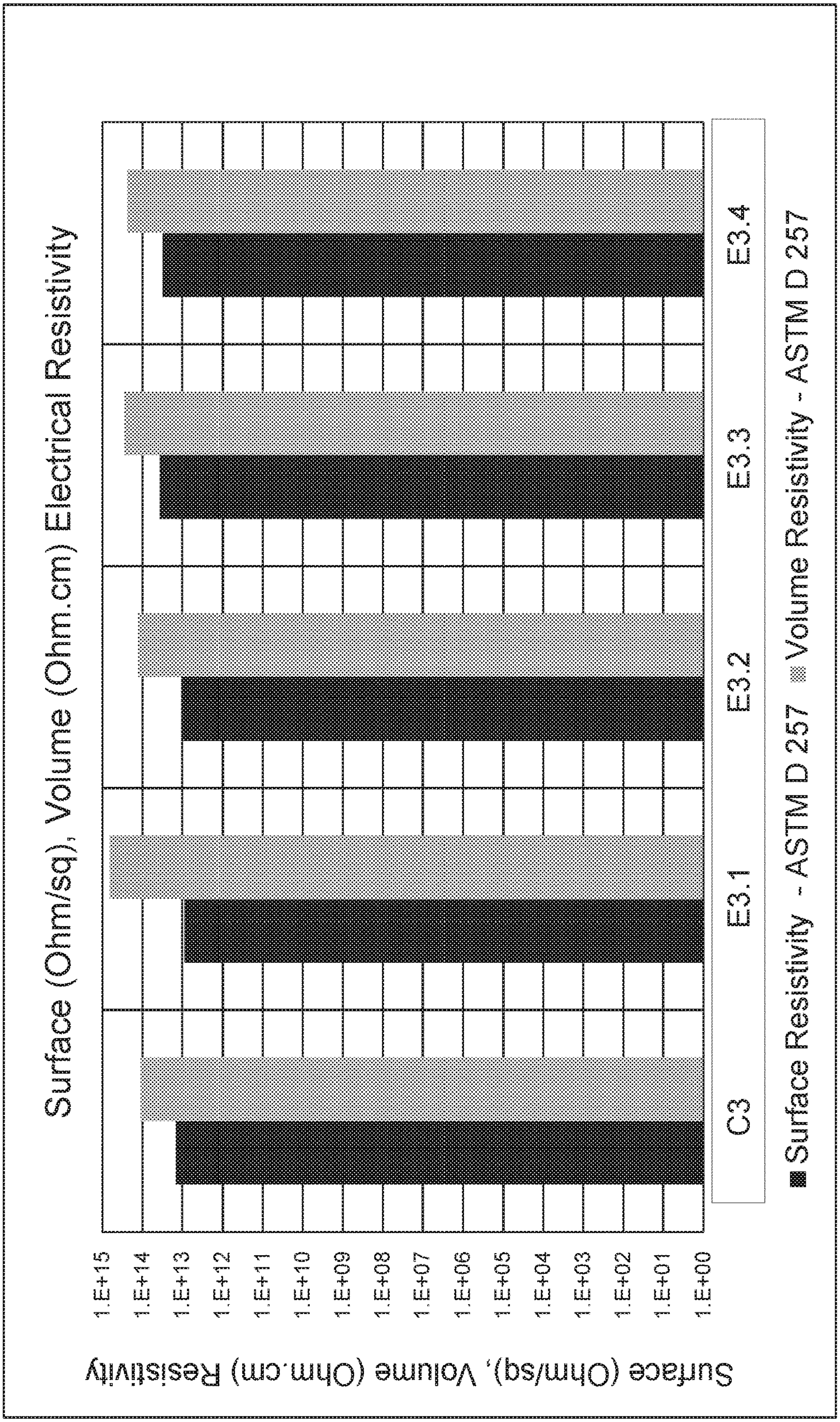
FIG. 7B is a graph illustrating surface and volume resistivities for example and comparative compositions according to aspects of the disclosure.

Similar results for the compositions including PC-Si copolymer (40 wt % siloxane content) were observed as shown in Table 3B and FIGS. 3A and 3B.

Figure 8A:
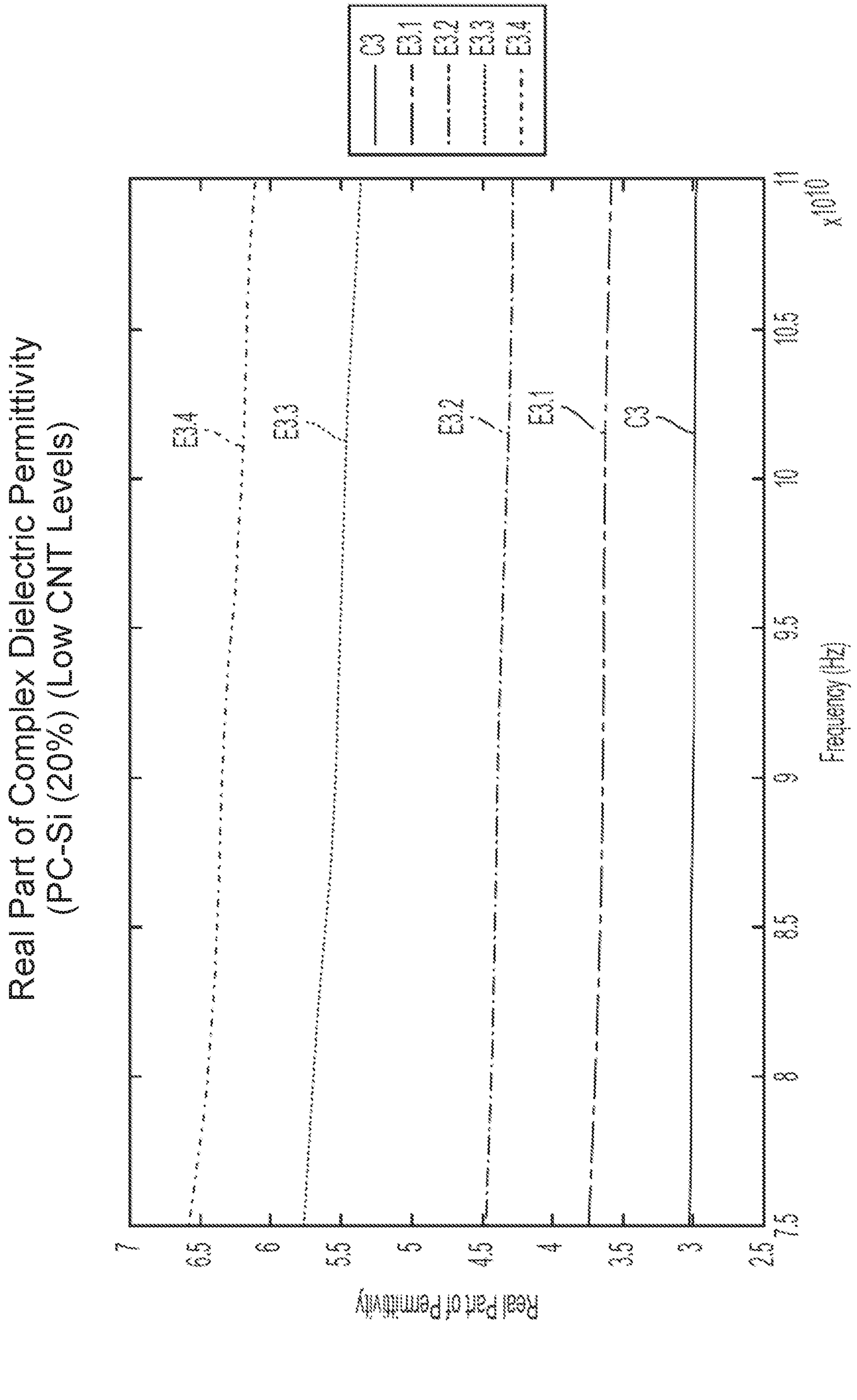
FIG. 8A is a graph illustrating the real part of the complex dielectric permittivity as a function of frequency in the W-band (75-110 GHz) for example and comparative compositions according to aspects of the disclosure.
Figure 8B:
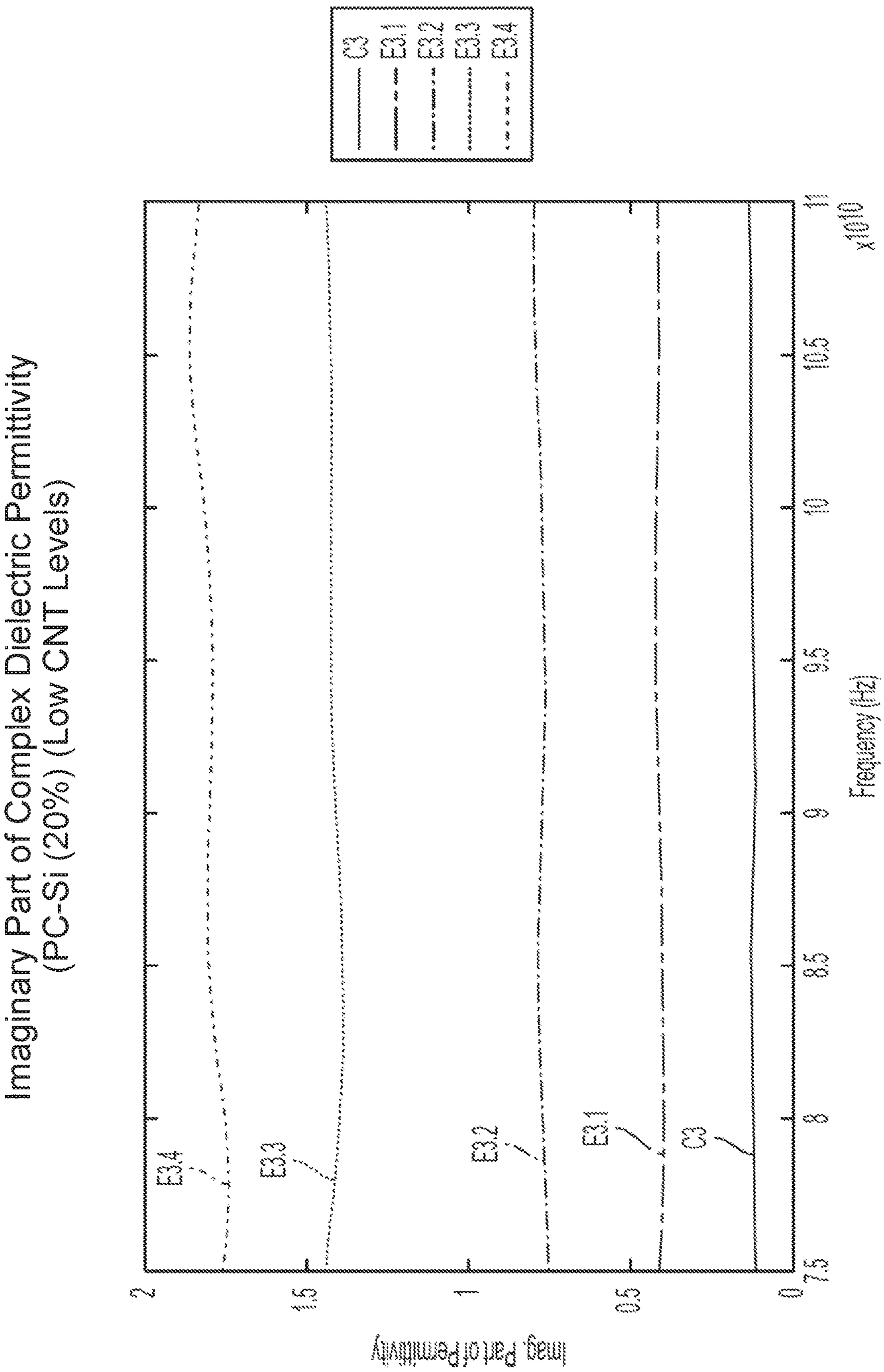
FIG. 8B is a graph illustrating the imaginary part of the complex dielectric permittivity as a function of frequency in the W-band (75-110 GHz) for example and comparative compositions according to aspects of the disclosure.
Figure 8C:
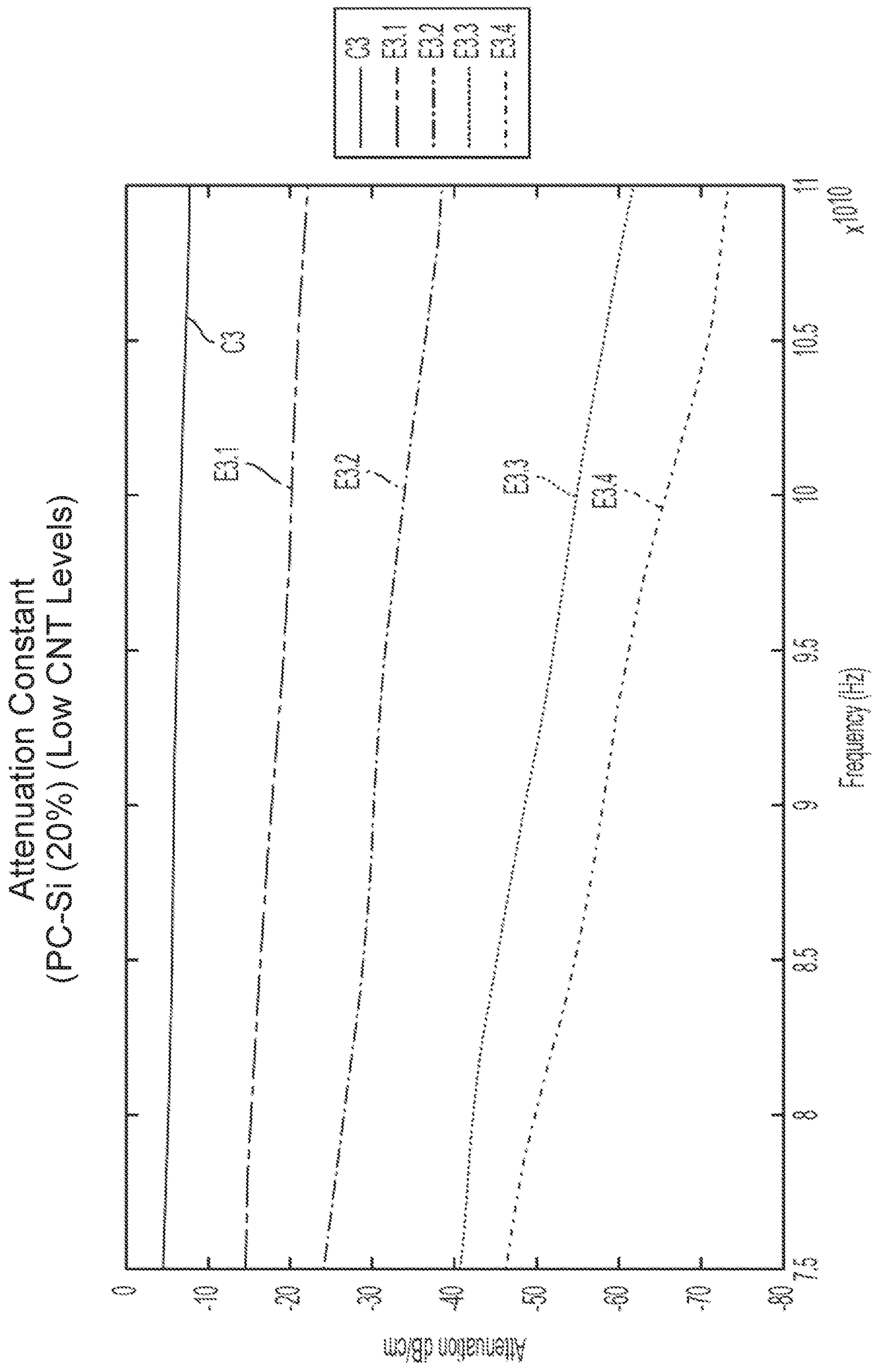
FIG. 8C is a graph illustrating attenuation constant as a function of frequency in the W-band (75-110 GHz) for example and comparative compositions according to aspects of the disclosure.
Figure 8D:
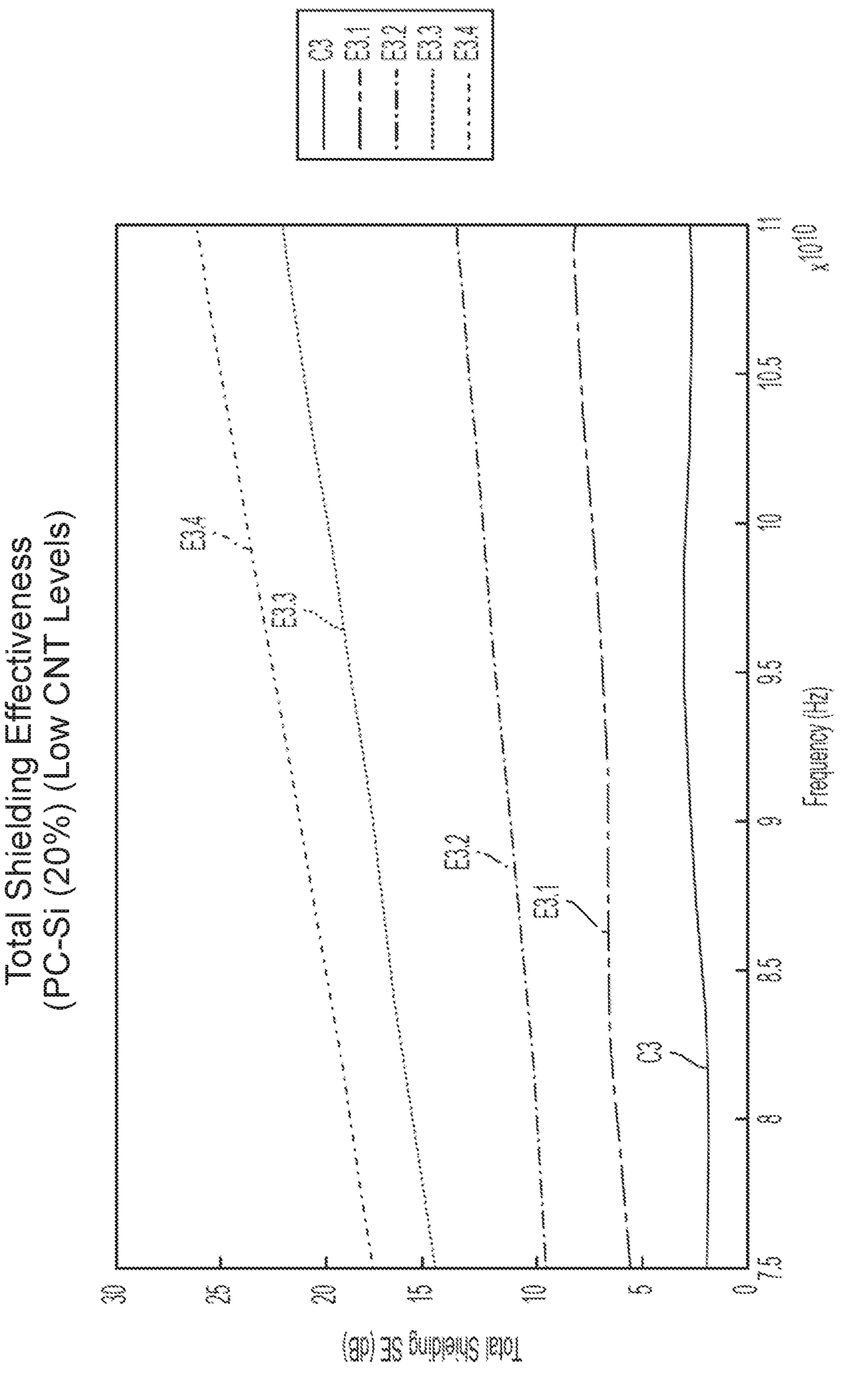
FIG. 8D is a graph illustrating total shielding effectiveness as a function of frequency in the W-band (75-110 GHz) for example and comparative compositions according to aspects of the disclosure.
Figure 8E:
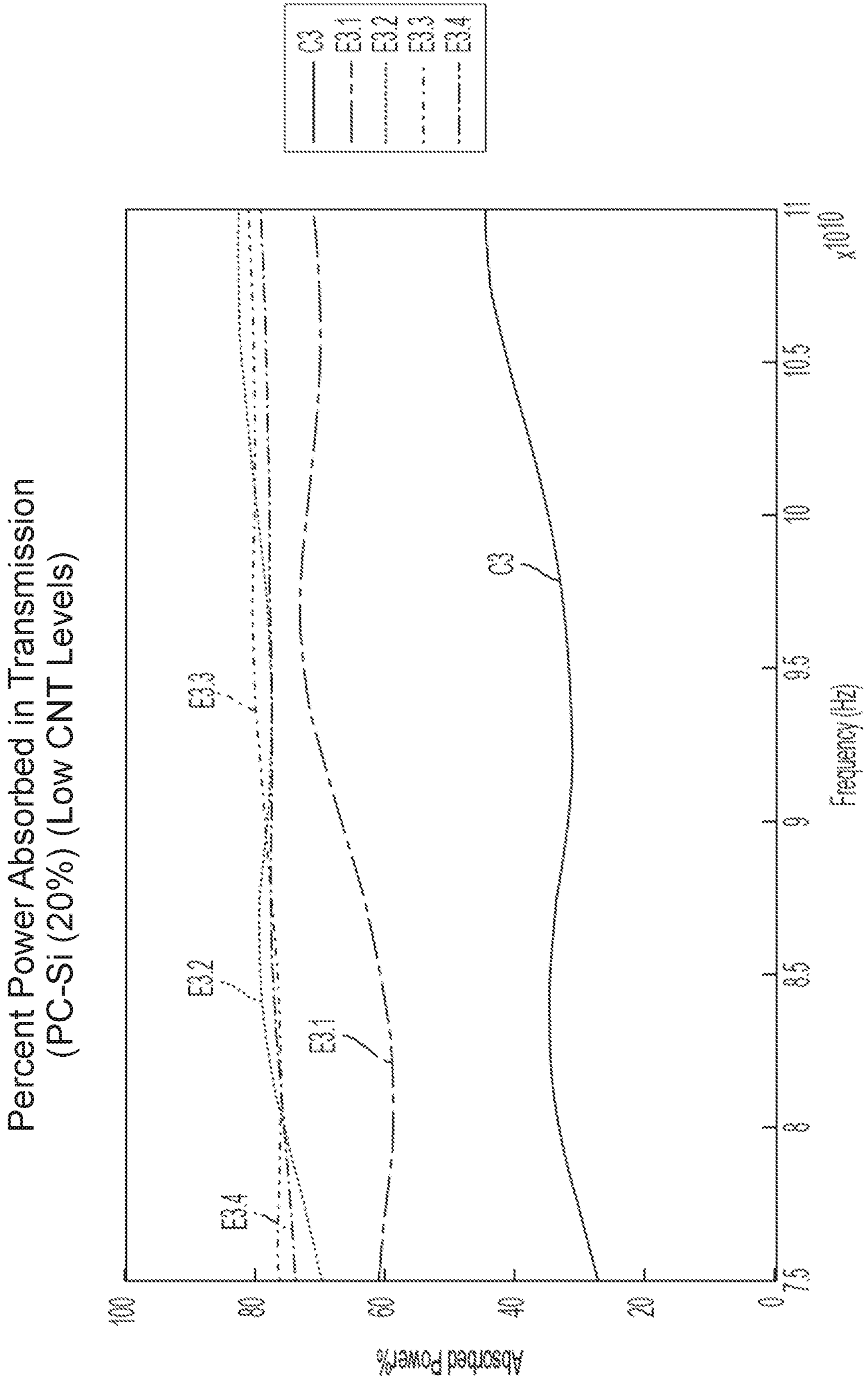
FIG. 8E is a graph illustrating percent absorbed power in transmission mode as a function of frequency in the W-band (75-110 GHz) for example and comparative compositions according to aspects of the disclosure.
Figure 9A:
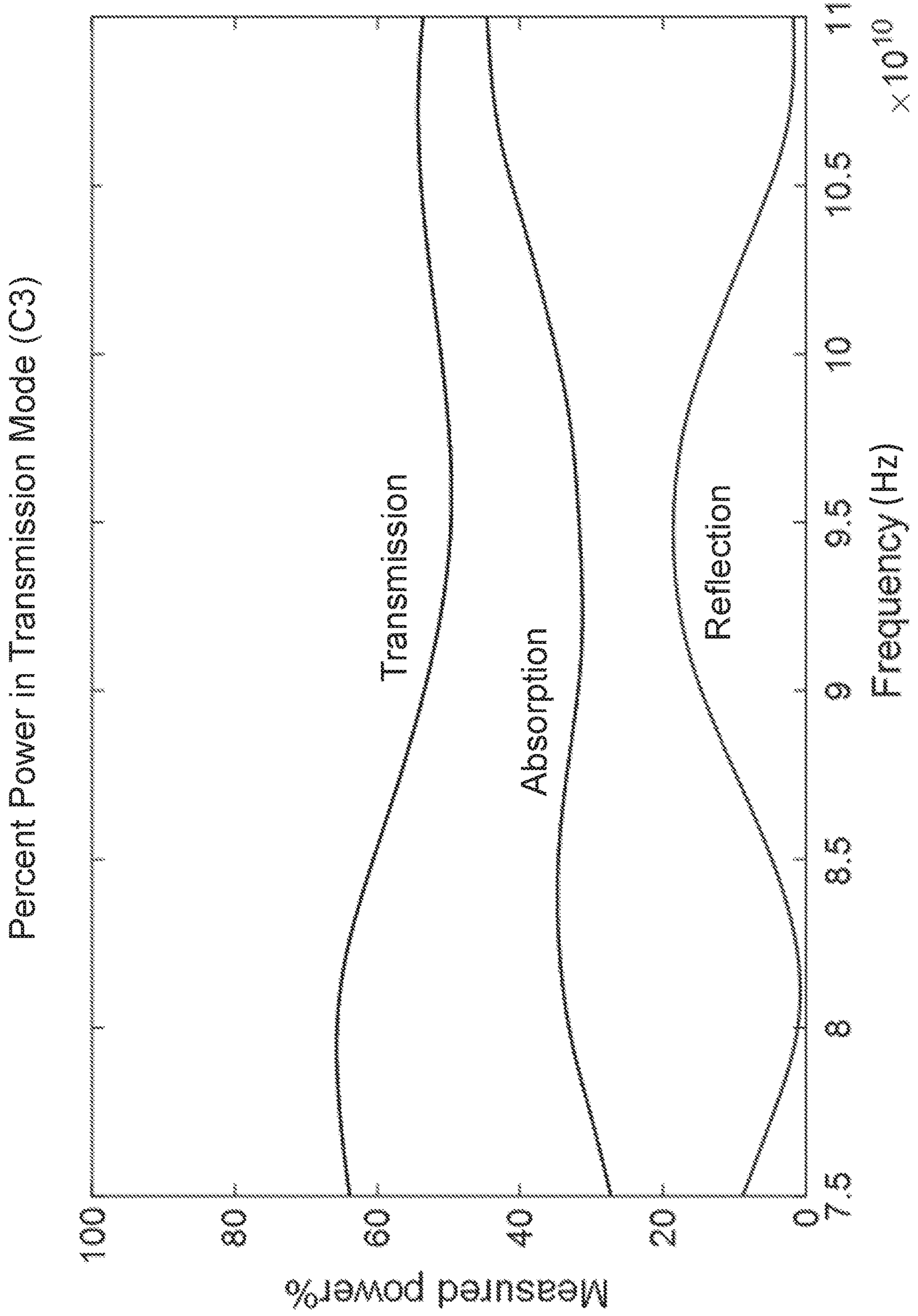
FIG. 9A is a graph illustrating absorbed, reflected and transmitted power as a function of frequency in the W-band (75-110 GHz) for comparative composition C3 according to aspects of the disclosure.
Figure 9B:
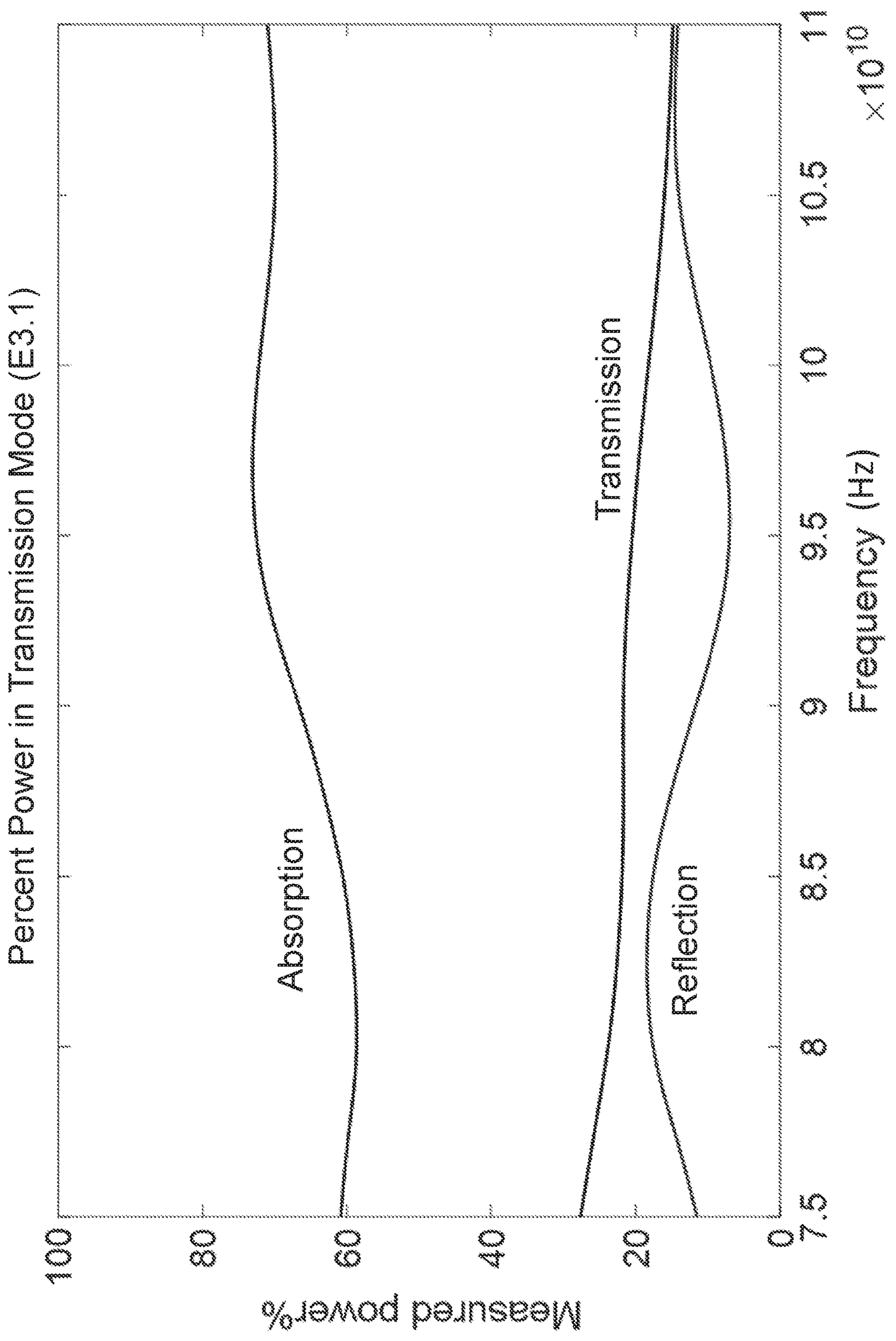
FIG. 9B is a graph illustrating absorbed, reflected and transmitted power as a function of frequency in the W-band (75-110 GHz) for example composition E3.1 according to aspects of the disclosure.
Figure 9C:
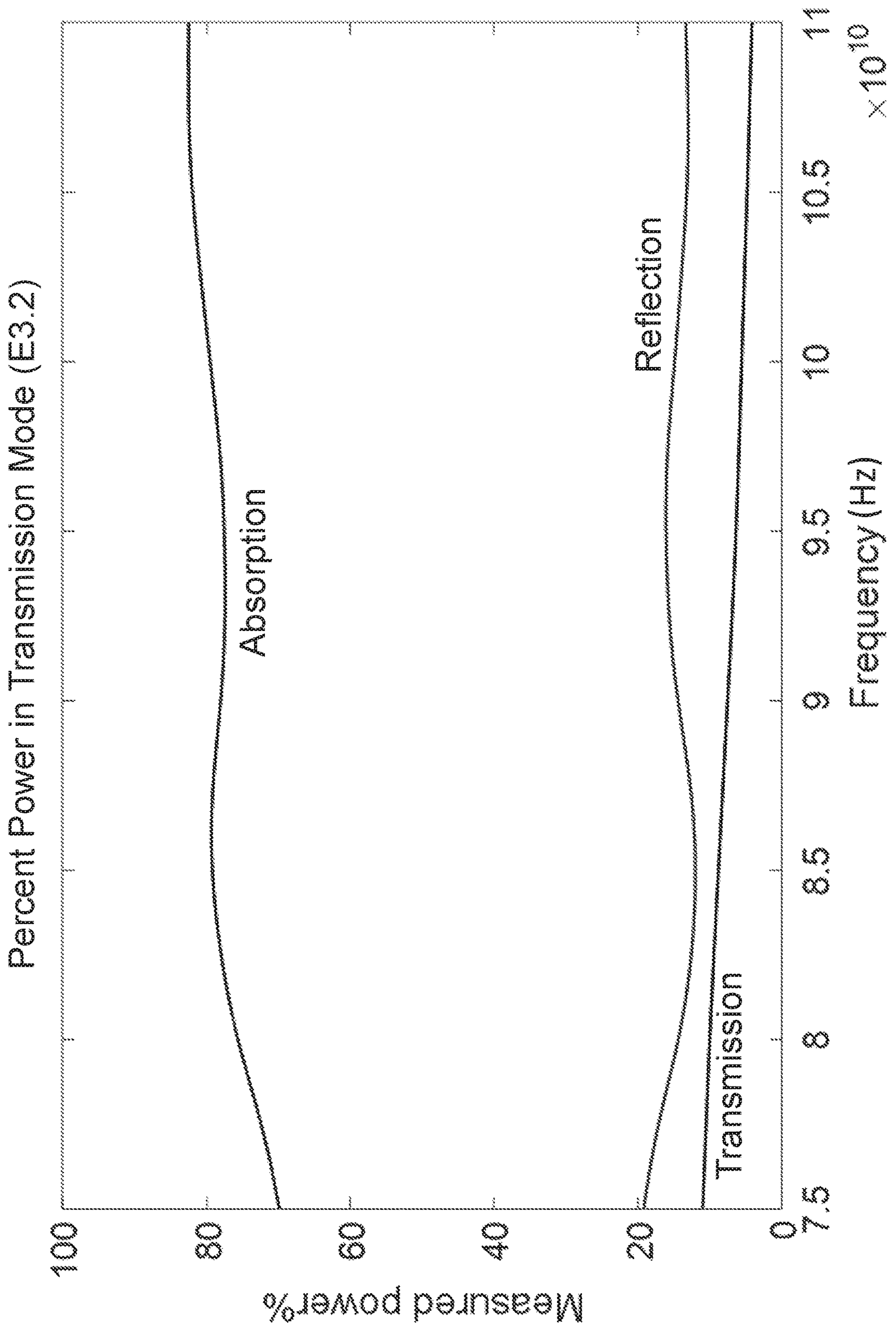
FIG. 9C is a graph illustrating absorbed, reflected and transmitted power as a function of frequency in the W-band (75-110 GHz) for example composition E3.2 according to aspects of the disclosure.
Figure 9D:
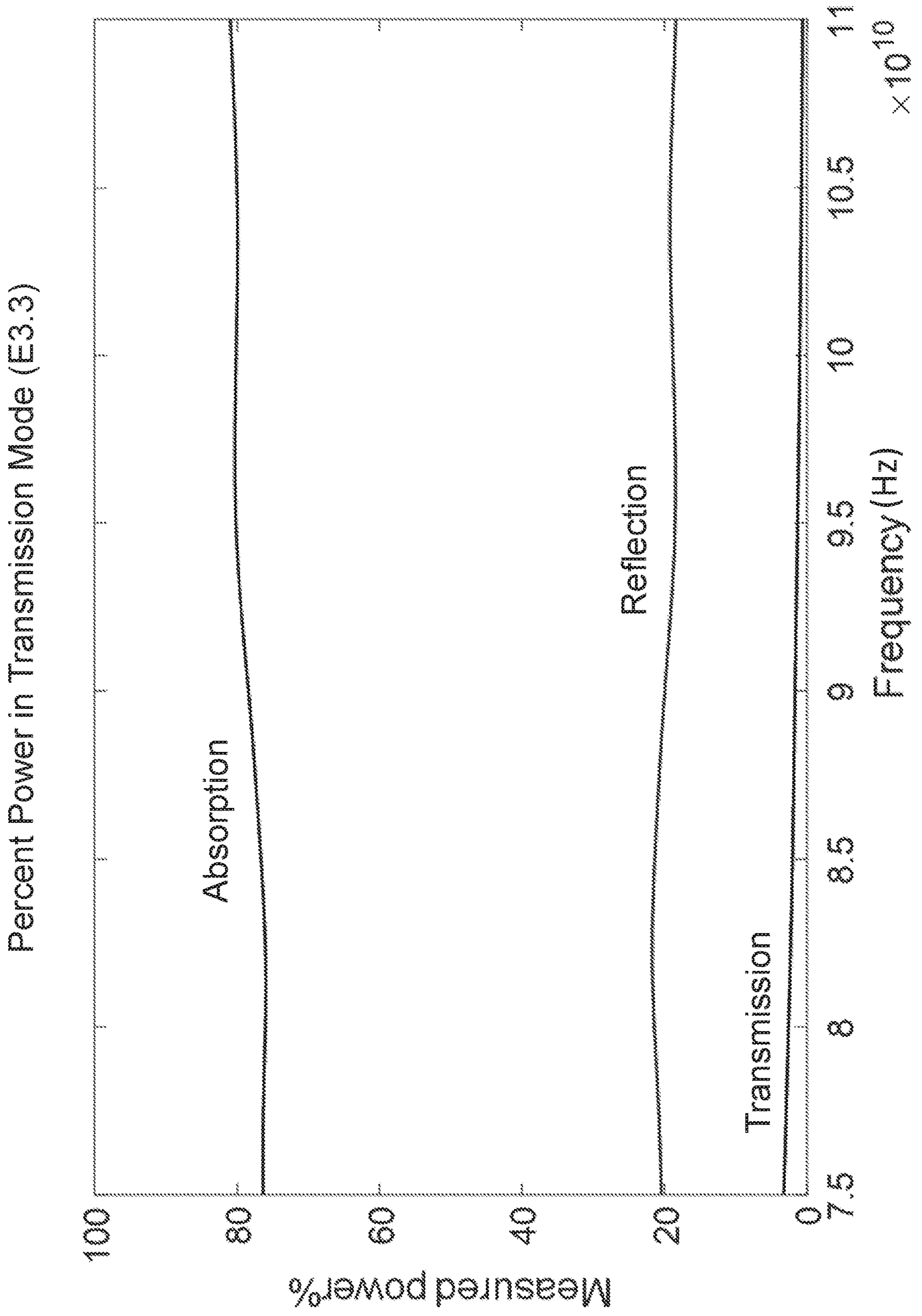
FIG. 9D is a graph illustrating absorbed, reflected and transmitted power as a function of frequency in the W-band (75-110 GHz) for example composition E3.3 according to aspects of the disclosure.
Figure 9E:
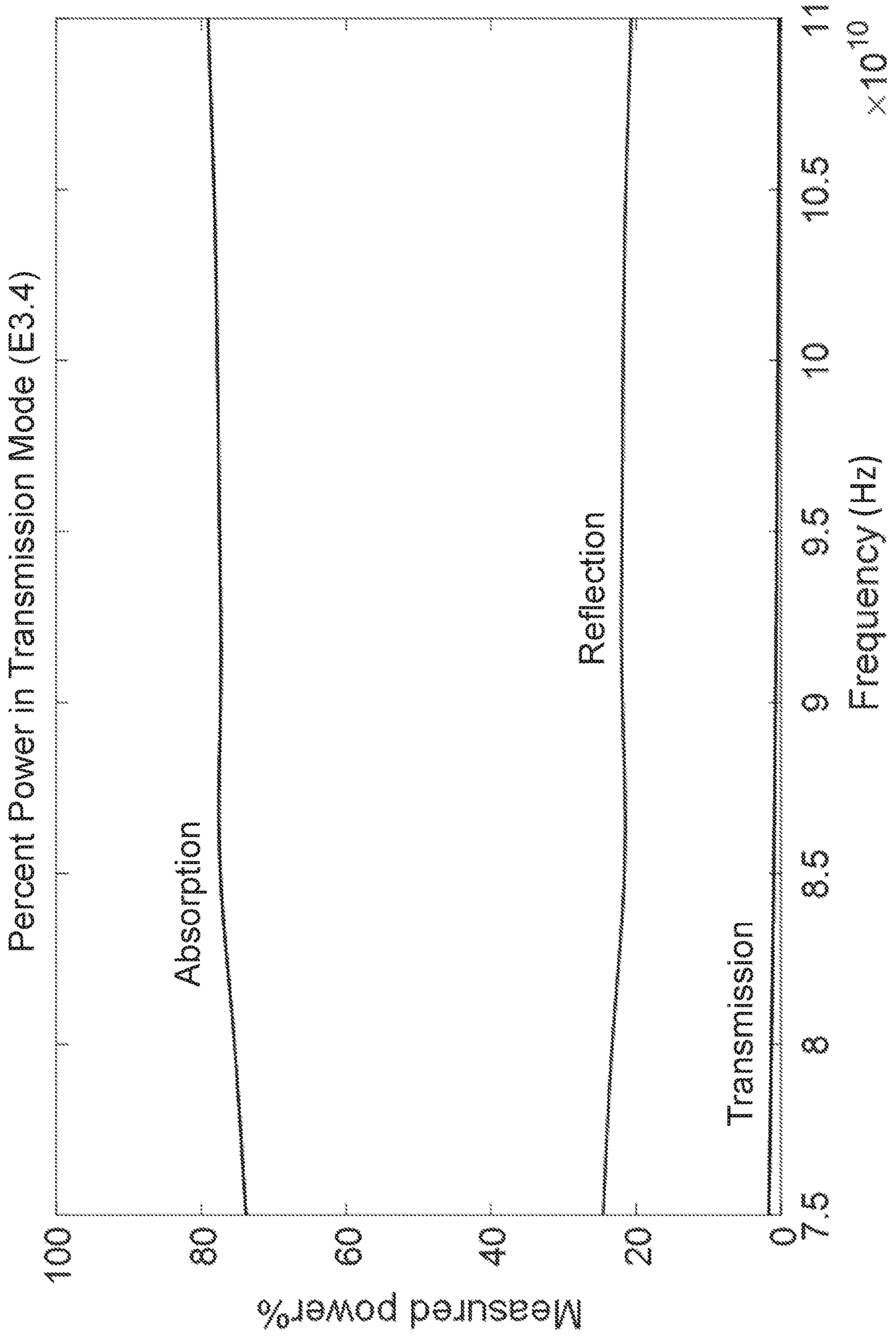
FIG. 9E is a graph illustrating absorbed, reflected and transmitted power as a function of frequency in the W-band (75-110 GHz) for example composition E3.4 according to aspects of the disclosure.

FIGS. 8A and 8B show that the real and imaginary parts of the complex dielectric permittivity both increased with the CNT loading in the formulation. FIG. 8C shows that the Attenuation Constant increased from about −5 dB/cm to over −45 dB/cm depending on the frequency of the W-band interrogated, and FIG. 8D shows that the Total Shielding Effectiveness increased from about 2 dB to over 15 dB when the CNT loading in the formulation increased. FIG. 8E shows that the Percent Absorbed Power in Transmission increased from about 25% for comparative composition C3 to over 60% for the Example compositions containing the higher levels of CNTs. FIGS. 9A to 9E show the Percent Power measured in Transmission Mode for comparative composition C3 and examples compositions E3.1 through E3.4, respectively, when measured in the W-band (75-110 GHZ). These figures show that the Percent Absorbed Power increased, and the Percent Transmitted Power decreased, when the concentration of CNTs in the composition increased. Example composition E3.4, for example, shows about 74% Absorption, 24% Reflection, and less than 2% Transmission when observed at 77 GHz frequency.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description as examples or aspects, with each claim standing on its own as a separate aspect, and it is contemplated that such aspects can be combined with each other in various combinations or permutations. The scope of the disclosure should be determined with reference to the appended claims, along with the full scope of equivalents to which such claims are entitled.

What is claimed is:

1. A thermoplastic composition comprising:

(a) a polycarbonate resin;

(b) a poly (carbonate-siloxane) copolymer having a siloxane content of at least about 5 wt %; and (c) from about 0.15 wt % to about 4.5 wt % of a carbon nanotube filler, wherein the carbon nanotubes have an average diameter of from about 8-12 nanometers (nm), a length of about 5 micron (μm) or less, a surface area of about 220 square meters per gram ($m^2$/gr) or higher, and a volume resistivity lower than about $10^{-2}$ Ohm·centimeters (Ohm·cm), the composition has a volume electrical resistivity of at least about 1.0E+06 Ohm·centimeters (Ohm·cm) as determined in accordance with ASTM D257, a molded sample of the composition has a percent absorbed power measured in Transmission mode of at least about 60% when observed according to a Free Space method at frequencies from about 75 GHz to 110 GHz, and the combined weight percent value of all components does not exceed 100 wt %, and all weight percent values are based on the total weight of the composition.

2. The thermoplastic composition according to claim 1, wherein the polycarbonate resin comprises a polycarbonate homopolymer, a polycarbonate copolymer different than the poly (carbonate-siloxane) copolymer in element (b), or a combination thereof.

3. The thermoplastic composition according to claim 1, wherein the poly (carbonate-siloxane) copolymer has a siloxane content of from about 5 wt % to about 50 wt %.

4. The thermoplastic composition according to claim 1, wherein the composition comprises from about 10 wt % to about 40 wt % of the poly (carbonate-siloxane) copolymer.

5. The thermoplastic composition according to claim 1, wherein the composition has a total siloxane content of from about 1 wt % to about 20 wt %.

6. The thermoplastic composition according to claim 1, wherein the composition comprises from about 0.15 wt % to about 1.5 wt % of the carbon nanotube filler.

7. The thermoplastic composition according to claim 1, wherein the carbon nanotube filler is incorporated into the composition in a form of a polycarbonate-based masterbatch comprising from about 10 wt % to about 20 wt % carbon nanotubes.

8. The thermoplastic composition according to claim 1, wherein the carbon nanotube filler is present in an amount of between about 0.5 wt % and about 1.5 wt. %, and wherein a molded sample of the composition has a percent absorbed power measured in Transmission mode of at least 75% when observed according to a Free Space method at a frequency of 77 GHz.

9. The thermoplastic composition according to claim 1, wherein the carbon nanotube filler is present in an amount of between about 0.15 wt % and about 1.5 wt. %, and wherein the composition has a volume electrical resistivity of at least about 1.2E+14 Ohm·cm as determined in accordance with ASTM D257.

10. The thermoplastic composition according to claim 1, wherein the composition has a notched Izod impact strength of at least 400 Joules per meter (J/m) at −30 degrees Celsius (° C.) as measured in accordance with ASTM D256.

11. The thermoplastic composition according to claim 1, wherein the polycarbonate resin in element (a) comprises at least two polycarbonate homopolymers, the at least two polycarbonate homopolymers comprising a first polycarbonate homopolymer having a melt flow rate (MFR) of less than 15 grams per 10 minutes (g/10 min) and a second polycarbonate homopolymer having a MFR of greater than 15 g/10 min, wherein MFR is determined at a load of 1.20 kilogram (kg), and a temperature of 300° C. in accordance with ASTM D1238.

12. The thermoplastic composition according to claim 11, wherein the first polycarbonate homopolymer and the second polycarbonate homopolymer are present in the composition in a ratio of from 1:3 to 3:1.

13. The thermoplastic composition according to claim 1, wherein the composition further comprises at least one additional additive comprising an acid scavenger, an anti-drip agent, an antioxidant, an antistatic agent, a chain extender, a colorant, a de-molding agent, a flow promoter, a lubricant, a mold release agent, a plasticizer, a quenching agent, a flame retardant, a UV reflecting additive, an impact modifier, a blowing agent, a reinforcing agent, or a combination thereof.

14. An article comprising the thermoplastic composition according to claim 1.

15. The article according to claim 14, wherein the article is a microwave absorber for a radar sensor.

* * * * *